US010848269B2

United States Patent
Ebrahimzad et al.

(10) Patent No.: US 10,848,269 B2
(45) Date of Patent: Nov. 24, 2020

(54) PROBABILISTIC CONSTELLATION SHAPING OF MULTI-DIMENSIONAL SYMBOLS FOR IMPROVED TOLERANCE TO NONLINEAR IMPAIRMENTS

(71) Applicant: Ciena Corporation, Hanover, MD (US)

(72) Inventors: Hamid Ebrahimzad, Ottawa (CA); Michael Andrew Reimer, Ottawa (CA); Vladimir S. Grigoryan, Elkridge, MD (US); Shahab Oveis Gharan, Nepean (CA)

(73) Assignee: Ciena Corporation, Hanove, MD (US)

( * ) Notice: Subject to any disclaimer, the term of this patent is extended or adjusted under 35 U.S.C. 154(b) by 0 days.

(21) Appl. No.: 16/599,157

(22) Filed: Oct. 11, 2019

(65) Prior Publication Data

US 2020/0119840 A1 Apr. 16, 2020

Related U.S. Application Data

(60) Provisional application No. 62/744,943, filed on Oct. 12, 2018.

(51) Int. Cl.
*H04B 10/58* (2013.01)
*H04L 1/00* (2006.01)
*H04B 10/556* (2013.01)

(52) U.S. Cl.
CPC ......... *H04L 1/0042* (2013.01); *H04B 10/556* (2013.01); *H04B 10/58* (2013.01); *H04L 1/0056* (2013.01)

(58) Field of Classification Search
None
See application file for complete search history.

(56) References Cited

U.S. PATENT DOCUMENTS

| 9,143,238 B2 * | 9/2015 | Roberts | H04B 10/532 |
| 9,698,939 B2 * | 7/2017 | Oveis Gharan | H04L 1/0003 |
| 9,749,058 B2 | 8/2017 | Reimer et al. | |
| 9,929,813 B1 * | 3/2018 | Batshon | H04B 10/516 |
| 10,069,519 B1 * | 9/2018 | Millar | H03M 13/6312 |
| 10,200,213 B1 * | 2/2019 | Mathews | H04L 65/4084 |

(Continued)

OTHER PUBLICATIONS

Cho et al., Low-Complexity Shaping for Enhanced Nonlinearity Tolerance, 2016 (Year: 2016).*

(Continued)

*Primary Examiner* — Jai M Lee
(74) *Attorney, Agent, or Firm* — Clements Bernard Walker; Lawrence A. Baratta, Jr.; Christopher L. Bernard

(57) ABSTRACT

An optical transmitter device includes a digital signal processor (DSP) having digital hardware. The DSP is operative to generate shaped bits from a first set of information bits, and to apply a systematic forward error correction (FEC) scheme to encode the shaped bits and a second set of information bits, where the first set of information bits and the second set of information bits are disjoint sets. Unshaped bits and the shaped bits are mapped to selected symbols or are used to select symbols from one or more constellations. The selected symbols are mapped to physical dimensions. Each unshaped bit is either one of the second set of information bits or one of multiple parity bits resulting from the FEC encoding. In this manner, a target spectral efficiency is achieved.

21 Claims, 11 Drawing Sheets

(56) References Cited

U.S. PATENT DOCUMENTS

| | | | |
|---|---|---|---|
| 10,396,899 B1* | 8/2019 | Kim | H04B 10/5561 |
| 10,541,711 B1* | 1/2020 | Millar | H04L 27/366 |
| 10,587,358 B1* | 3/2020 | Ebrahimzad | H04J 14/0298 |
| 10,601,517 B1* | 3/2020 | Kim | H04B 10/541 |
| 2008/0212694 A1* | 9/2008 | Leach | H04L 27/2601 |
| | | | 375/260 |
| 2018/0091225 A1* | 3/2018 | Wang | H04B 10/541 |
| 2019/0052509 A1* | 2/2019 | Krishnan | H04L 1/0043 |
| 2019/0149239 A1* | 5/2019 | Tehrani | H04L 27/3411 |
| | | | 398/183 |
| 2019/0190651 A1* | 6/2019 | Oveis Gharan | H04L 1/0048 |
| 2019/0215077 A1* | 7/2019 | Chien | H04L 25/03834 |
| 2019/0280809 A1* | 9/2019 | Cho | H04L 1/0071 |

OTHER PUBLICATIONS

Cho, et al., "Experimental Demonstration of Physical-Layer Security in a Fiber-Optic Link by Information Scrambling", ECOC 2016.

Cho, et al., "Low-Complexity Shaping for Enhanced Nonlinearity Tolerance", 42nd European Conference and Exhibition on Optical Communications, Sep. 18-22, 2016.

Reimer, et al., "Optimized 4 and 8 Dimensional Modulation Formats for Variable Capacity in Optical Networks", In Optical Fiber Communication Conference 2016, OSA Technical Digest (online), M3A.4.

Schulte, et al., "Constant Composition Distribution Matching", IEEE Trans. Info. Theory, vol. 62, No. 1, pp. 430-434 (2016).

Shiner, et al., "Demonstration of an 8-dimensional modulation format with reduced inter-channel nonlinearities in a polarization multiplexed coherent system", Optical Society of America: vol. 22, No. 17, pp. 20366-20374, Aug. 2014.

Fischer, et al., "Bandwidth-Variable Transceivers based on Four-Dimensional Modulation Formats", Journal of Lightwave Technology, vol. 32, No. 16, Aug. 15, 2014, pp. 2886-2895.

Schmalen, "Probabilistic Constellation Shaping: Challenges and Opportunites for Forward Error Correction", 2018 Optical Fiber Communications Conference and Exposition (OFC), Optical Society of America (OSA), Mar. 11, 2018, pp. 1-3.

Skraparlis, "International Search Report for PCT/IB2019/058669", dated Apr. 29, 2020.

Skraparlis, "Written Opinion of ISA for PCT/IB2019/058669", dated Apr. 29, 2020.

Wang, et al., "On Enhancing Hierarchical Modulation", 2008 IEEE International Symposium on Broadband Multimedia Systems and Broadcasting, IEEE, Piscataway, NJ, USA, Mar. 31, 2008, pp. 1-6.

* cited by examiner

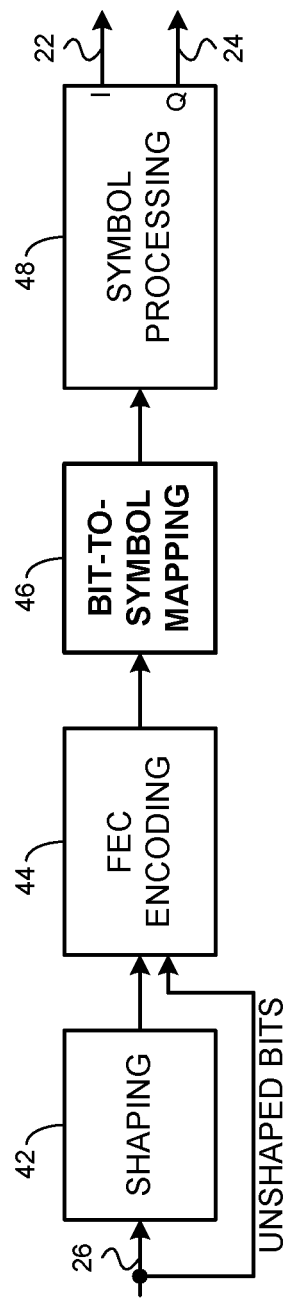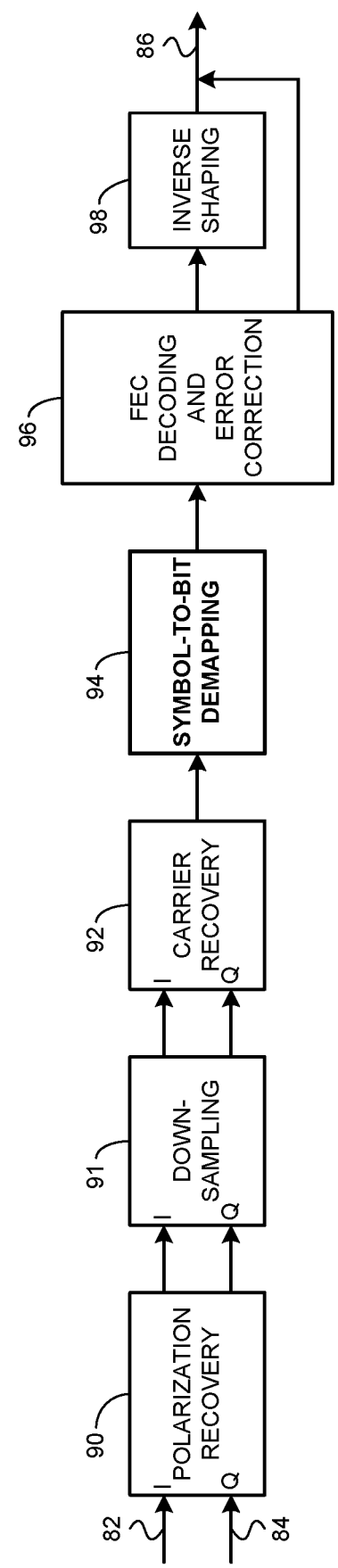

US 10,848,269 B2

PROBABILISTIC CONSTELLATION SHAPING OF MULTI-DIMENSIONAL SYMBOLS FOR IMPROVED TOLERANCE TO NONLINEAR IMPAIRMENTS

CROSS-REFERENCE

This application claims the benefit of U.S. patent application Ser. No. 62/744,943 filed Oct. 12, 2018, the entire contents of which are incorporated herein by reference.

TECHNICAL FIELD

This document relates to the technical field of probabilistic constellation shaping.

BACKGROUND

Probabilistic constellation shaping (PCS) is a technique that allows control over the visitation probabilities of different constellation symbols, yielding unequal visitation probabilities. PCS allows the number of bits per symbol (sometimes referred to as the "spectral efficiency") to be varied in a (nearly) continuous manner without requiring support for multiple discrete constellations to be implemented. When the probability distribution of the visitation probabilities is Gaussian, PCS improves the linear noise tolerance relative to standard modulation having equal visitation probabilities for all symbols.

Various PCS implementations are known in the art, including, for example, the implementations described in U.S. Pat. No. 9,698,939, and in J. Cho et al., "Low-complexity shaping for enhanced nonlinearity tolerance", *Proceedings of ECOC* 2016, pp. 467-469.

In some implementations, the constellation that is shaped is a high-cardinality quadrature amplitude modulation (QAM) format such as 64 QAM or 256 QAM, and the probability of selecting a given symbol decreases with that symbol's energy. More specifically, the probability of selecting the i-th symbol $S_i$ in the constellation alphabet is proportional to $\exp(-\mu|S_i|^2)$ for a constant $\mu$ that depends on the target bits per symbol.

QAM formats significantly increase nonlinear interference on low-dispersion metro or submarine applications.

SUMMARY

Some modulation formats have constant symbol energy, in that the symbol modulus $|S_i|^2$ is the same for all symbols, which improves nonlinear performance by minimizing variations in the amplitude of the optical field. Examples of such modulation formats include binary phase shift keying (BPSK), quadrature phase shift keying (QPSK), and polarization-balanced 8-dimensional formats (described below). Polarization-balanced 8-dimensional formats have the additional property that the polarization vector in the first time slot is orthogonal to that of the second time slot. Polarization balancing leads to a partial cancellation of cross-polarization modulation, with the most benefit observed on dispersion-compensated submarine system. However, with a constant symbol energy, there is only a single data rate.

This document describes novel constellations for bit-to-symbol mapping and symbol-to-bit demapping that make use of shaped bits and unshaped bits to achieve a target spectral efficiency (defined as a number of information bits per time slot) while preserving constellation qualities that are beneficial for tolerance to nonlinear effects. Such qualities include power-balancing (that is, constant symbol energy) and polarization-balancing.

BRIEF DESCRIPTION OF THE DRAWINGS AND APPENDIX

FIG. 2 illustrates functionality of an example transmitter digital signal processor;

FIG. 3 illustrates functionality of an example receiver digital signal processor;

Appendix provides an example partition of $QPSK_{AUG}^3$ into four disjoint subsets satisfying a Euclidean distance constraint.

DETAILED DESCRIPTION

Throughout the application, ordinal numbers (e.g., first, second, third, etc.) may be used as an adjective for an element (that is, any noun in the application). The use of ordinal numbers is not to imply or create any particular ordering of the element unless expressly disclosed, such as by use of the terms "before", "after", and other such terminology. The use of ordinal numbers is not to limit any element to being only a single element unless expressly disclosed, such as by use of the term "single" and other such terminology. Rather, the use of ordinal numbers is to distinguish between the elements. By way of an example, a first element is distinct from a second element, and the first element may encompass more than one element and succeed (or precede) the second element in an ordering of elements.

Figure 1:
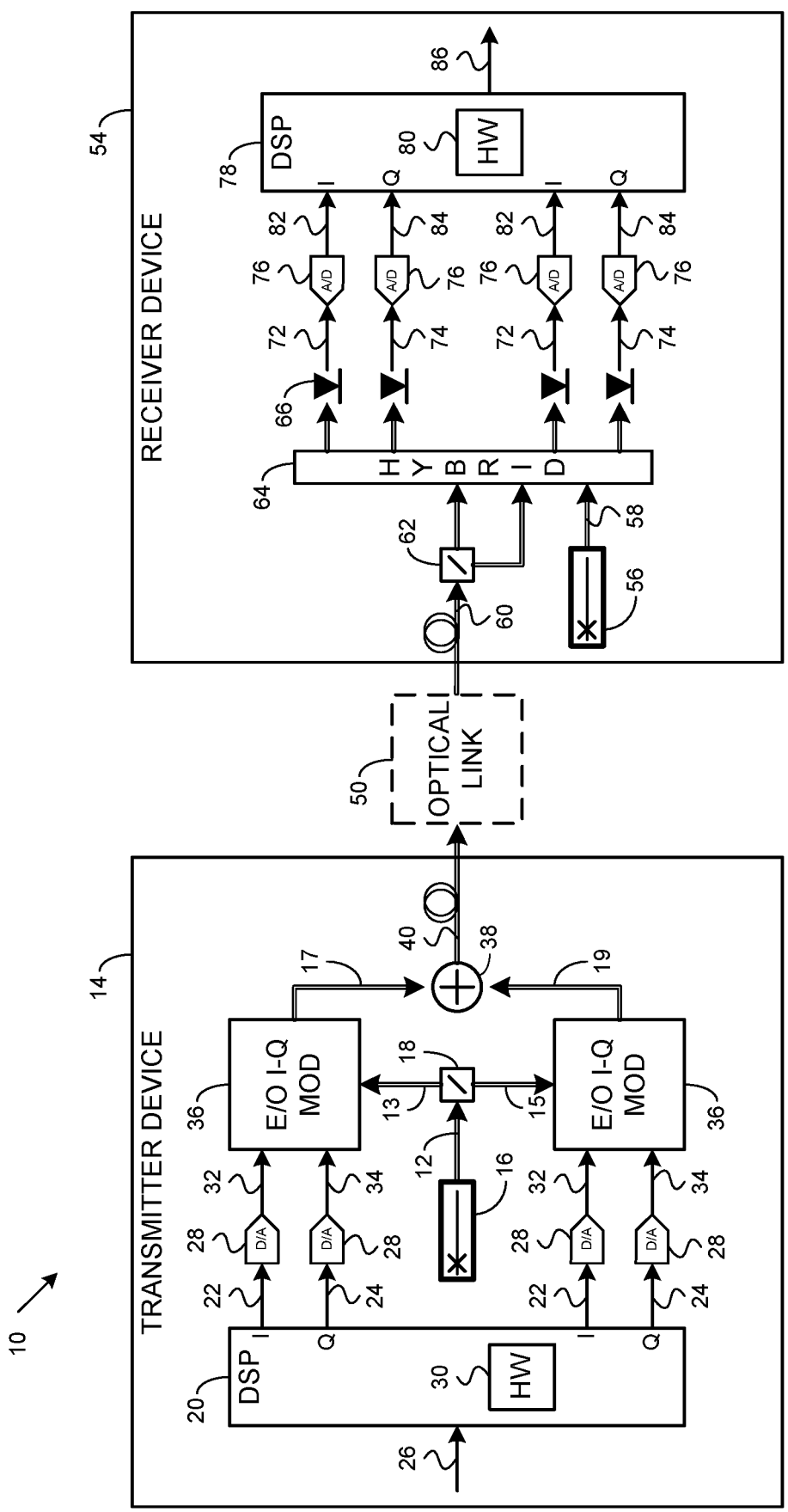
FIG. 1 illustrates an example coherent optical communications system that employs polarization-division multiplexing (PDM)

FIG. 1 illustrates an example coherent optical communications system 10 that uses phase modulation (and optionally amplitude modulation) of an optical carrier signal 12 to convey information. The system employs polarization-division multiplexing (PDM).

A transmitter device 14 ("transmitter 14") in the example coherent communications system 10 comprises a laser 16 to produce the optical carrier signal 12, and a polarization beam splitter 18 to split the optical carrier signal 12 into two orthogonally-polarized components 13,15.

A digital signal processor (DSP) 20 in the transmitter 14 generates two pairs of in-phase (I) digital drive signals 22 and quadrature (Q) digital drive signals 24 from information bits 26. Digital-to-analog converters 28 convert the I/Q digital drive signals 22, 24 into respective I/Q analog drive signals 32, 34. Each pair of the I/Q analog drive signals 32, 34 drives a respective electrical-to-optical modulator 36 (for example, a Mach-Zehnder modulator) to modulate a respective one of the orthogonally-polarized components 13,15 of the optical carrier signal 12, thereby generating a respective modulated polarized optical signal 17,19. The transmitter 14 comprises a polarization beam combiner 38 that combines the two modulated polarized optical signals 17,19, thereby yielding a modulated optical carrier signal 40 for transmission on an optical link 50. For simplicity, additional components of the transmitter 14 such as amplifiers are not illustrated or discussed in this document.

The optical link 50 may comprise one or more of optical fibers, optical amplifiers, repeaters, wavelength selection switch (WSS) nodes, optical add-drop multiplexers (OADMs), reconfigurable OADMs (ROADMs), and optical power taps for link monitoring and diagnostics.

The information bits 26 to be conveyed by the modulated carrier do not necessarily have any particular underlying spectral structure. The information bits 26 may be completely arbitrary. The information bits 26 may be encrypted data bits resulting from the application of conventional encryption techniques (with or without built-in authentication). The information bits 26 may have been scrambled using any suitable scrambling technique.

The transmitter DSP 20 is digital hardware 30 supported by software/firmware stored in a memory (not shown). An example of the functionality implemented by the transmitter DSP 20 is illustrated in FIG. 2. In this example, the functionality includes probabilistic constellation shaping (PCS) 42, forward error correction (FEC) encoding 44 according to a systematic FEC scheme, mapping 46 of FEC-encoded bits to symbols, processing 48 of the symbols, and extraction of the I/Q components of the processed symbols as the I/Q digital drive signals for each polarization 22, 24.

A portion of the information bits (denoted a "first set of information bits") are shaped. Various PCS implementations are known in the art, including, for example, the implementations described in U.S. Pat. No. 9,698,939, and in J. Cho et al., "Experimental demonstration of physical-layer security in a fiber-optic link by information scrambling", *ECOC 2016*. Development of new PCS implementations is ongoing.

Another portion of the information bits (denoted a "second set of information bits") remain unshaped. The first set of information bits and the second set of information are disjoint sets, which means no information bit belongs to both the first set and the second set.

The FEC encoding 44 is applied to the shaped bits and to the second set of information bits. Systematic FEC encoding 44 preserves the shaping of the shaped bits. The output of the systematic FEC encoding 44 is FEC-encoded bits, which consist of the shaped bits, the second set of information bits, and multiple parity bits. The multiple parity bits have a probability of being equal to 1 substantially equal to 0.5.

Returning now to FIG. 1, a receiver device 54 ("receiver 54") in the example coherent optical communications system 10 comprises a laser 56 to generate a local version 58 of the optical carrier signal 12. The receiver 54 is operative to receive a received modulated optical carrier signal 60. The received modulated optical carrier signal 60 is a distorted version of the modulated optical carrier signal 40 that was transmitted by the transmitter 14. The receiver comprises a polarization beam splitter 62 to split the received modulated optical carrier signal 60 into two orthogonally-polarized components. An optical hybrid 64 mixes the local version 58 of the optical carrier signal with the orthogonally-polarized components of the received modulated carrier signal 60, and photodetectors 66 are used to yield two pairs of I/Q analog signals 72, 74. Analog-to-digital converters 76 sample the pairs of I/Q analog signals 72, 74 to yield respective pairs of I/Q digital signals 82, 84. A DSP 78 in the receiver 54 processes the two pairs of I/Q digital signals 82, 84 to yield recovered bits 86. For simplicity, additional components of the receiver 54 such as amplifiers are not illustrated or discussed in this document.

In an ideal coherent communications system 10, the recovered bits 86 are identical to the information bits 26. In practice, however, impairments in the transmitter 14, the link 50, and the receiver 54 cause errors in the recovered bits 86.

The receiver DSP 78 is digital hardware 80 supported by software/firmware stored in a memory (not shown). An example of the functionality implemented by the receiver DSP 78 is illustrated in FIG. 3. In this example, the functionality includes polarization recovery 90 which identifies the X- and Y-polarizations of the modulated optical carrier signal, down-sampling 91 to extract the received optical symbols from the I/Q digital signals 82, 84, carrier recovery 92 which corrects variation in the phase of the received optical symbols, de-mapping 94 of the processed symbols to FEC-encoded bits, FEC decoding and error-correction 96 of the FEC-encoded bits, and inverse shaping 98 of a portion of the error-corrected FEC-decoded bits to yield, together with the portion of the error-corrected FEC-decoded bits that do not require inverse shaping, the recovered bits 86.

This document describes novel constellations for bit-to-symbol mapping and symbol-to-bit demapping that make use of shaped bits and unshaped bits to achieve a target spectral efficiency (defined as a number of information bits per time slot) while preserving constellation qualities that are beneficial for tolerance to nonlinear effects. Such qualities include power-balancing and polarization-balancing, as demonstrated in A. Shiner et al., "Demonstration of an 8-dimensional modulation format with reduced inter-channel nonlinearities in a polarization multiplexed coherent system", *Opt. Expr.* vol. 22, issue 17, pp. 20366-20374 (2014) and M. Reimer et al., "Optimized 4 and 8 dimensional modulation formats for variable capacity in optical networks", *In Optical Fiber Communication Conference 2016, OSA Technical Digest (online)*, M3A.4. Polarization balancing is also described in U.S. Pat. No. 9,143,238, entitled "Optical modulation schemes having reduced nonlinear optical transmission impairments". These constellations and bit-to-symbol mapping and symbol-to-bit demapping techniques may be suitable for applications having spectral efficiencies nominally between 1 and 6 bits per time slot appropriate for low net dispersion optical systems for regional or submarine transmission distances.

This document describes how to adapt tree-encoder PCS for shaping bits to be used with the novel constellations.

A normalized quadrature phase shift keying (QPSK) constellation has an alphabet of four complex-valued symbols, for example $$\left\{S_1 = \exp\left(i\frac{\pi}{4}\right), S_2 = \exp\left(i\frac{3\pi}{4}\right), S_3 = \exp\left(i\frac{5\pi}{4}\right), S_4 = \exp\left(i\frac{7\pi}{4}\right)\right\} \text{ or}$$

$$\{S_1 = 1, S_2 = -1, S_3 = i, S_4 = -i\}.$$

Figure 4:
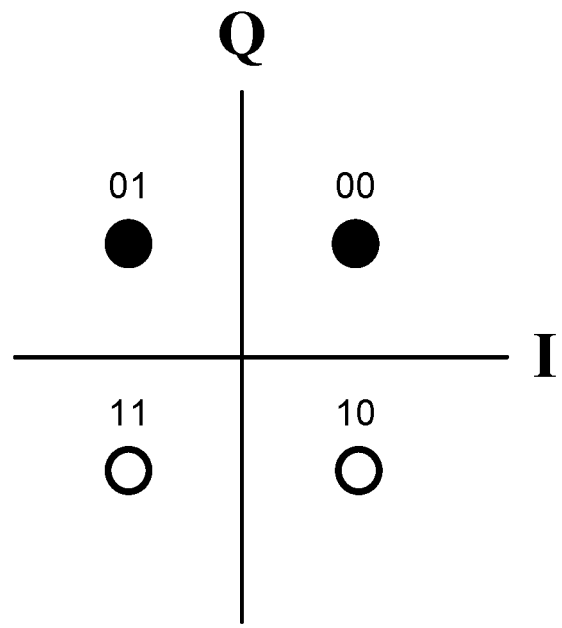
FIG. 4 and FIG. 5 illustrate two example labeling schemes for a quadrature phase shift keying (QPSK) constellation.
Figure 5:
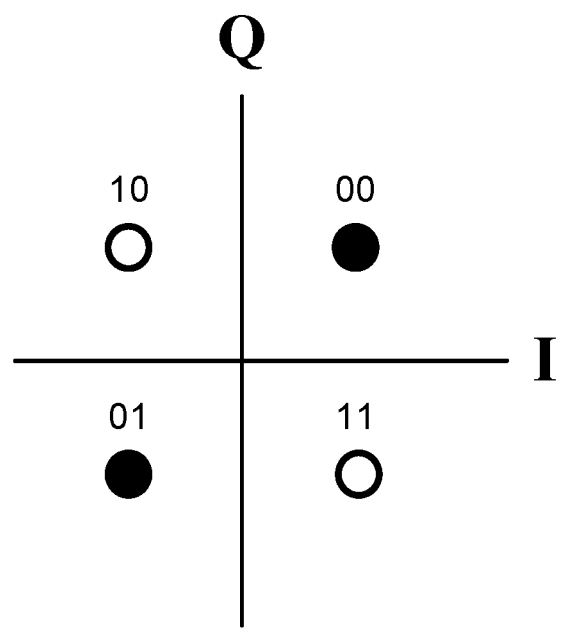

The complex-valued symbols have the same energy and differ only in phase. Each complex-valued symbol can be labelled using 2 bits. FIG. 4 and FIG. 5 illustrate two example labeling schemes for the QPSK constellation.

Figure 6:
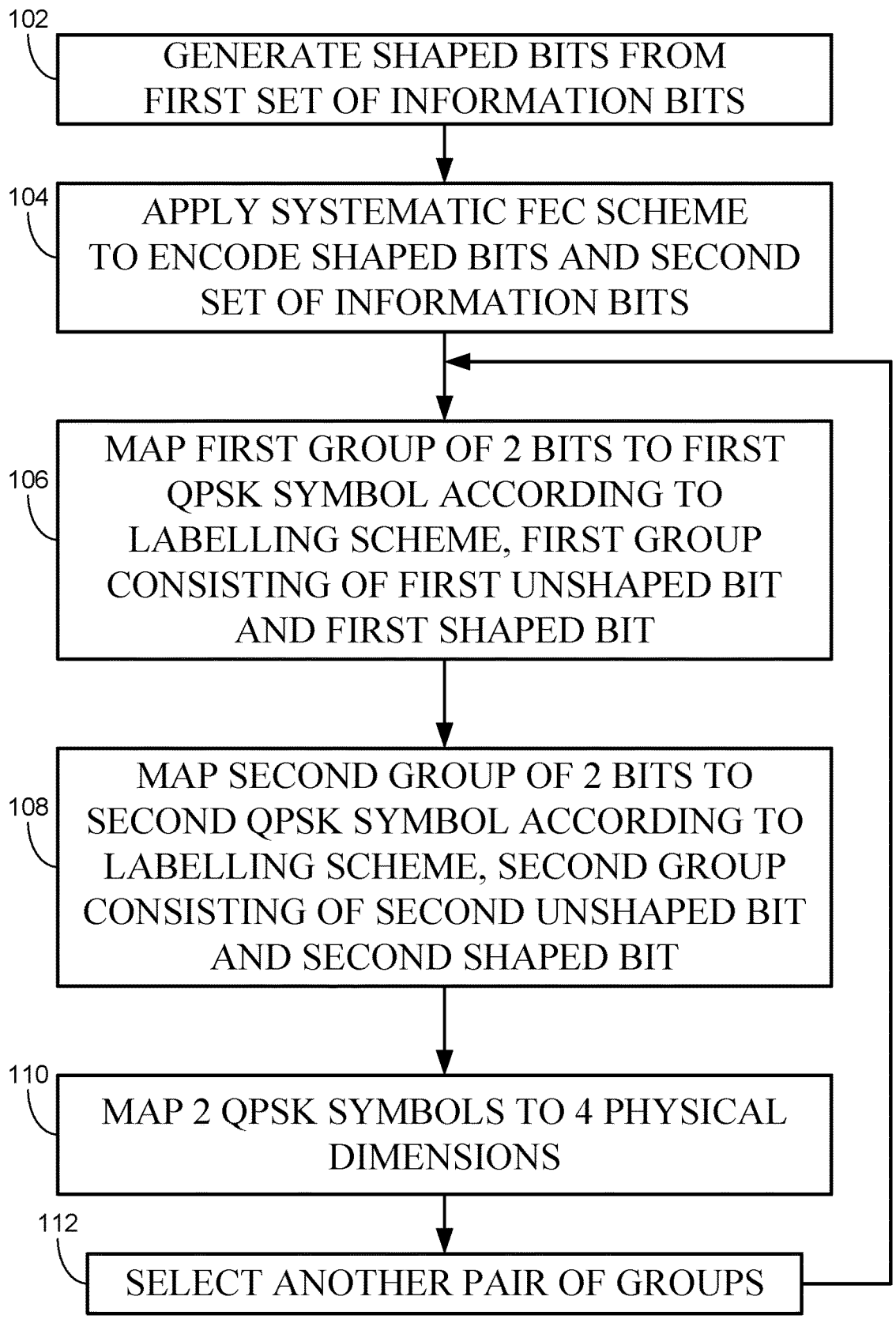
FIG. 6 is a flowchart illustration of an example method for transmission.

FIG. 6 is a flowchart of an example method for transmission. A target spectral efficiency between 2 and 4 bits per time slot may be achieved with the method illustrated in FIG. 6. for selecting QPSK symbols. The DSP 20 generates (102) shaped bits from a first set of information bits. The DSP 20 applies (104) a systematic FEC scheme to encode the shaped bits and a second set of information bits, where the first set of information bits and the second set of information bits are disjoint sets.

The DSP 20 maps (106) a first group of two bits to a first symbol of a QPSK constellation according to a labeling scheme. The first group consists of a first unshaped bit and a first one of the shaped bits. The DSP 20 maps (108) a second group of two bits to a second symbol of a QPSK constellation according to the labeling scheme. The second group consists of a second unshaped bit and a second one of the shaped bits. Each unshaped bit is either one of the second set of information bits or one of multiple parity bits resulting from the FEC encoding.

The DSP 20 maps (110) the first QPSK symbol and the second QPSK symbol to four physical dimensions. The physical dimensions may be spread across any suitable combination of polarization, time, carrier (or subcarrier) wavelength, fiber propagation mode, or core within a multi-core fiber. For example, the four physical dimensions may be amplitude and phase (or equivalently, in-phase and quadrature) of two orthogonally-polarized components of an optical carrier signal.

The DSP 20 selects (112) another pair consisting of a new first group and a new second group and proceeds to handle the bits of those groups as described above.

Figure 7:
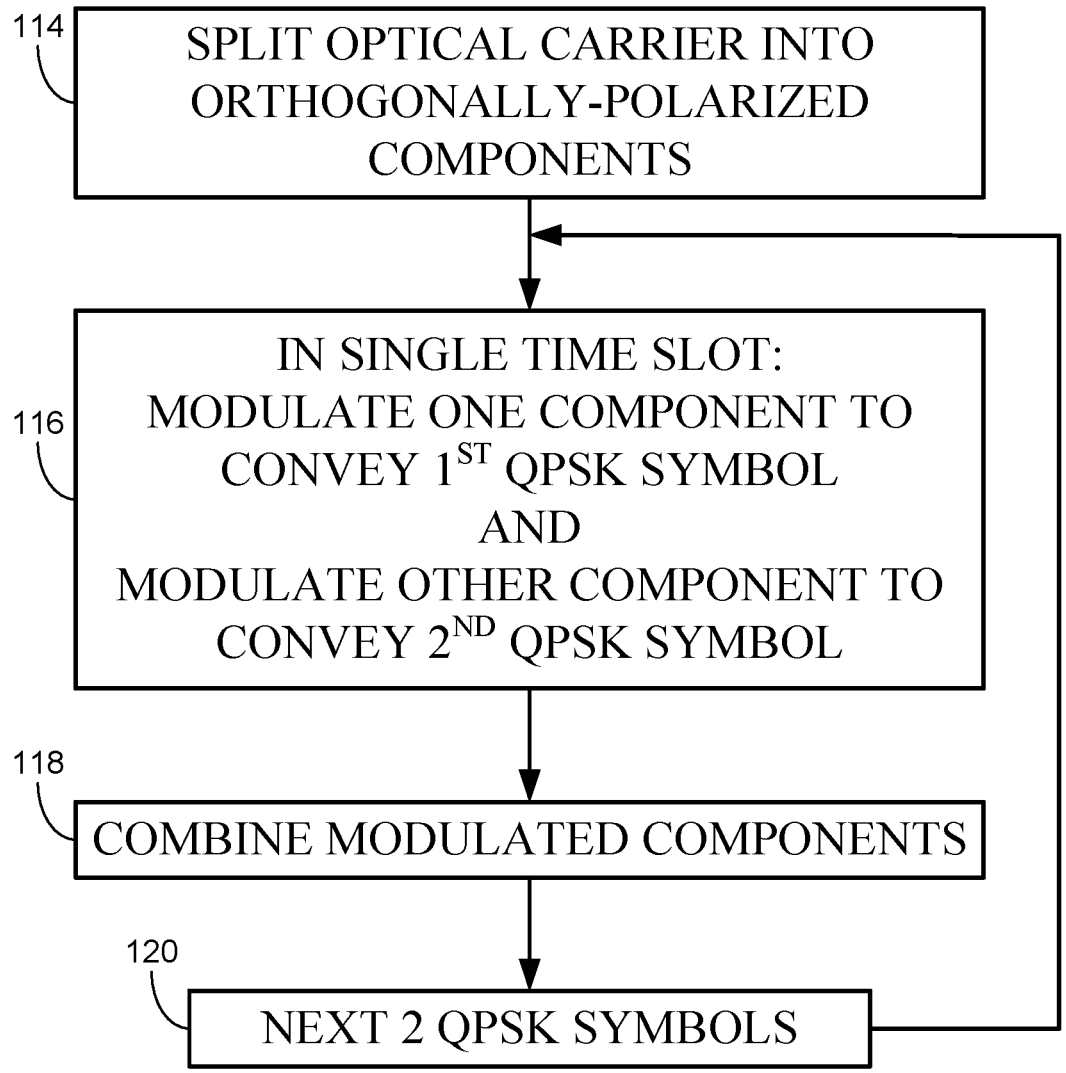
FIG. 7 is a flowchart illustration of an example method for handling two QPSK symbols that have been mapped to four physical dimensions.

FIG. 7 is a flowchart of an example method for handling two QPSK symbols that have been mapped to four physical dimensions. The polarization beam splitter 18 splits (114) an optical carrier into two orthogonally-polarized components. In a single time slot, one of the electrical-to-optical modulators 36 modulates (116) the orthogonally-polarized component 13 to convey the first QPSK symbol (or a processed version thereof), and the other of the electrical-to-optical modulators 36 modulates (116) the orthogonally-polarized component 15 to convey the second QPSK symbol (or a processed version thereof). The polarization beam combiner 38 combines (405) the two modulated polarized optical signals 17,19 for transmission.

Let $b_0$ denote the shaped bit and $b_1$ denote the unshaped bit. Let $P(0)$ denote the probability of the shaped bit $b_0$ being equal to 0, and $P(1)$ denote the probability of the shaped bit $b_0$ being equal to 1.

In one implementation, the most significant bit in all groups is always one of the shaped bits. Then $b_0 b_1$ is the two-bit group that is mapped to one of the symbols of the QPSK constellation. Suppose the probability P(0) is 0.65 and the probability P(1) is 0.35. With the labeling scheme illustrated in FIG. 4 or the labeling scheme illustrated in FIG. 5, the QPSK symbols illustrated as black circles will be visited more often than the QPSK symbols illustrated as white circles, because the shaped bit $b_0$ is the most significant bit and is more likely to be equal to 0 than equal to 1.

In another implementation, the least significant bit in all groups is always one of the unshaped bits. Then $b_1 b_0$ is the two-bit group that is mapped to one of the symbols of the QPSK constellation. Suppose the probability P(0) is 0.8 and the probability P(1) is 0.2. With the labeling scheme illustrated in FIG. 4, the QPSK symbols to the right of the Q axis will be visited more often than the QPSK symbols to the left of the Q axis, because the shaped bit $b_0$ is the least significant bit and is much more likely to be equal to 0 than equal to 1. With the labeling scheme illustrated in FIG. 5, the QPSK symbols above the I axis will be visited more often than the QPSK symbols below the I axis, because the shaped bit $b_0$ is the least significant bit and is much more likely to be equal to 0 than equal to 1.

In circumstances where the probability P(0) is 0.5, all symbols of the QPSK constellation are visited with equal probability, and the spectral efficiency is 4 bits per time slot in a dual-polarization system.

In circumstances where the probability P(0) is 0 or 1, two symbols of the QPSK constellation are visited with equal probability and the other two symbols are never visited, so effectively this is similar to a BPSK constellation, and the spectral efficiency is 2 bits per time slot in a dual-polarization system.

In circumstances where the probability P(0) satisfies 0<P(0)<0.5 or 0.5<P(0)<1, the spectral efficiency is between 2 and 4 bits per time slot in a dual polarization system.

The spectral efficiency $\epsilon$, in units of bits per time slot, may be calculated as follows.

$$\epsilon = 2 \cdot [1 - P(0)\log_2 P(0) - P(1)\log_2 P(1)] \quad (1)$$

Figure 8:
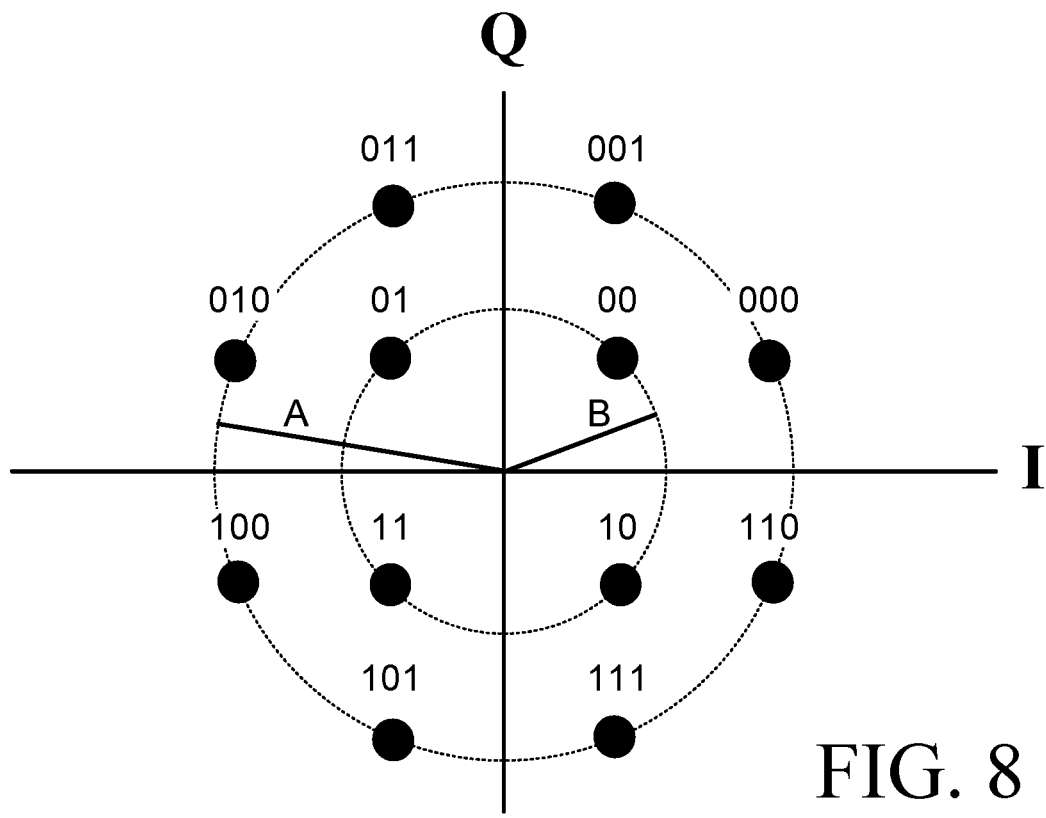
FIG. 8 illustrates a super-constellation formed as the union of an 8PSK constellation having a larger amplitude and a QPSK constellation having a smaller amplitude.

FIG. 8 illustrates a super-constellation formed as the union of an 8PSK constellation whose symbols have an amplitude A and a QPSK constellation whose symbols have an amplitude B. For convenience, this super-constellation is referred to as the "outer 8PSK-inner QPSK" super-constellation. A and B are real positive numbers subject to the constraints that B<A and $A^2+B^2=1$, as discussed in U.S. Pat. No. 9,749,058, entitled "Nonlinear tolerant optical modulation formats at high spectral efficiency". In practice, the sum of squares may differ slightly from 1. For example, the sum $A^2+B^2$ may have a value in the range between 0.95 and 1.05, inclusive. A normalized 8 phase shift keying (8PSK) constellation has an alphabet of eight complex-valued symbols, for example $$\left\{U_1 = \exp\left(i\frac{\pi}{8}\right), U_2 = \exp\left(i\frac{3\pi}{8}\right), U_3 = \exp\left(i\frac{5\pi}{8}\right), U_4 = \exp\left(i\frac{7\pi}{8}\right),\right.$$
$$\left. U_5 = \exp\left(i\frac{9\pi}{8}\right), U_6 = \exp\left(i\frac{11\pi}{8}\right), U_7 = \exp\left(i\frac{13\pi}{8}\right), U_8 = \exp\left(i\frac{15\pi}{8}\right)\right\}.$$

In practice, the phases of the complex-valued symbols may be optimized for improved tolerance to additive noise. The complex-valued symbols have the same power and differ only in phase. Each complex-valued symbol can be labelled using 3 bits. Example labeling schemes for the 8PSK constellation and for the QPSK constellation are illustrated in FIG. 8.

Figure 9:
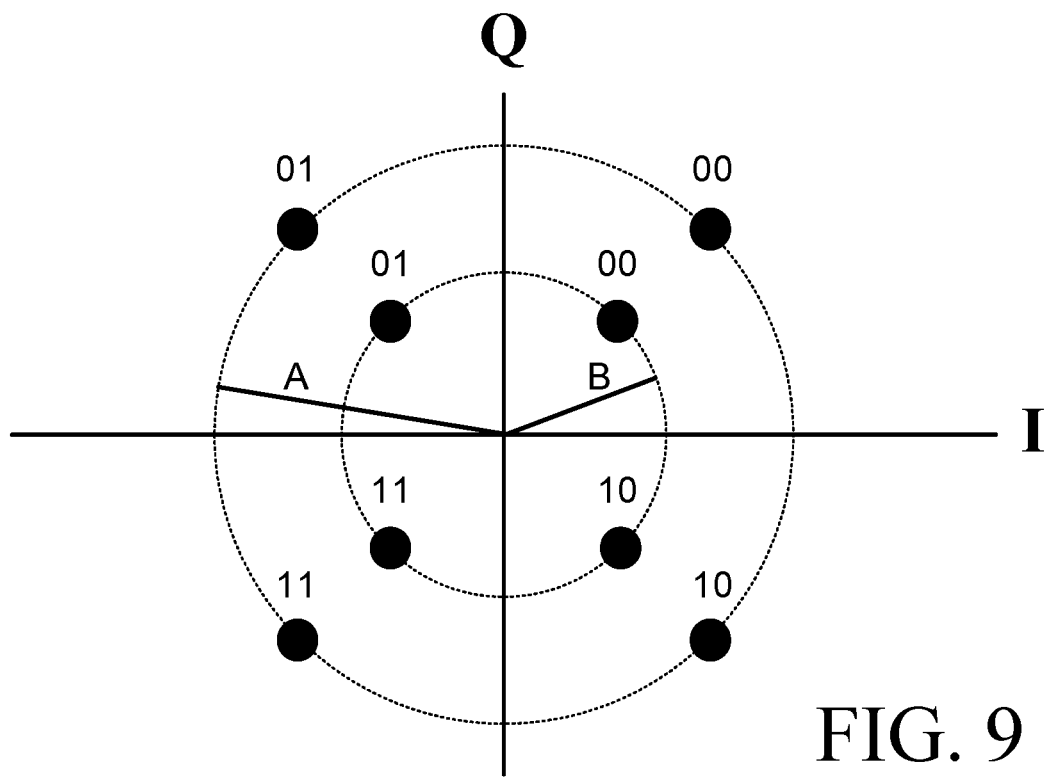
FIG. 9 illustrates a super-constellation formed as the union of a QPSK constellation having a larger amplitude and a QPSK constellation having a smaller amplitude.

FIG. 9 illustrates a super-constellation formed as the union of an outer QPSK constellation whose symbols have an amplitude A and an inner QPSK constellation whose symbols have an amplitude B. For convenience, this super-constellation is referred to as the "outer QPSK-inner QPSK"

super-constellation. A and B are real positive numbers subject to the constraints that B<A and $A^2+B^2=1$. In practice, the sum of squares may differ slightly from 1. For example, the sum $A^2+B^2$ may have a value in the range between 0.95 and 1.05, inclusive. Example labeling schemes for both QPSK constellations are illustrated in FIG. 9.

Figure 10:
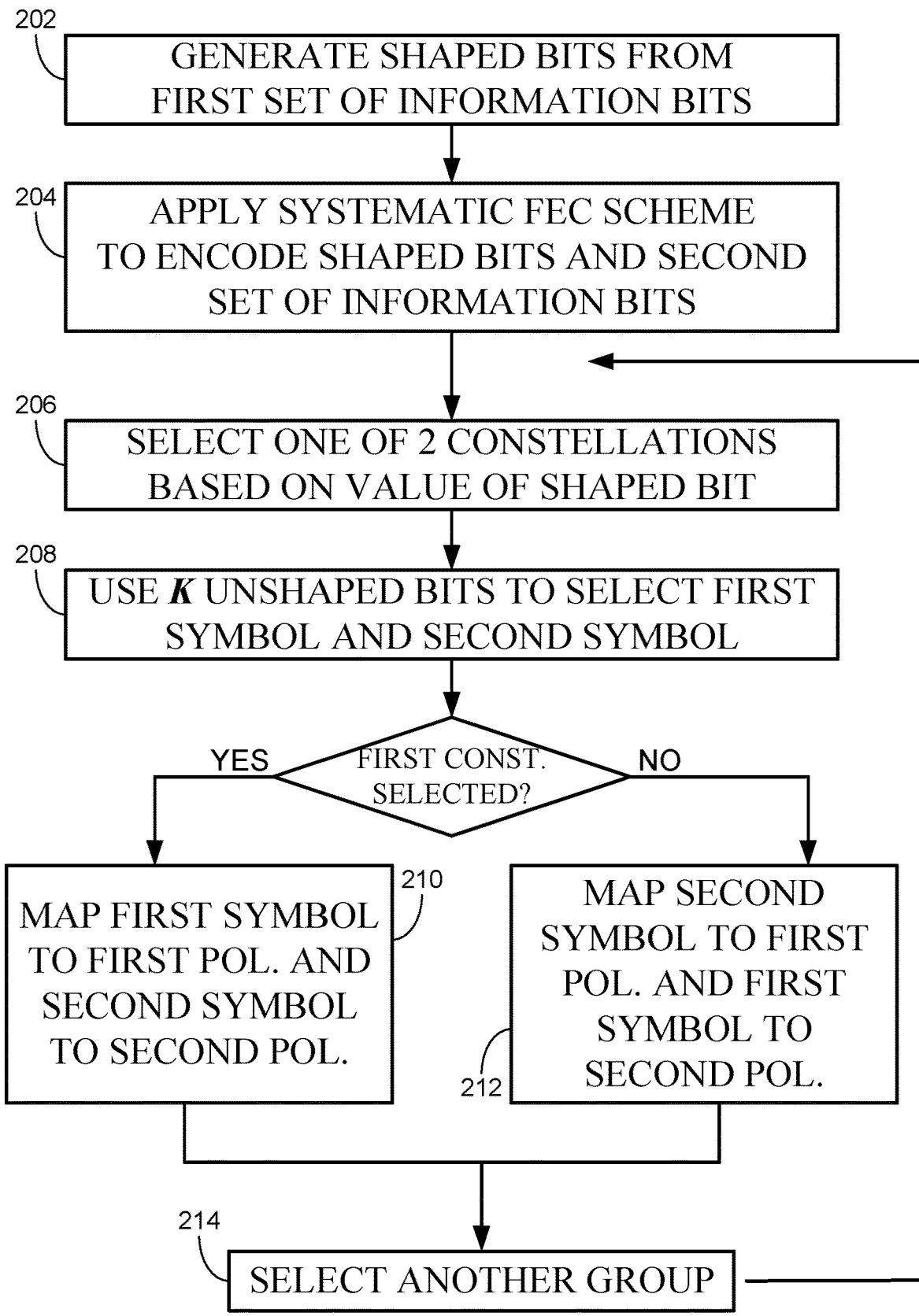
FIG. 10 is a flowchart illustration of an example method for optical transmission using the super-constellation formed as the union of an outer constellation of constant energy and an inner constellation of constant energy.

FIG. 10 is a flowchart illustration of an example method for optical transmission using a super-constellation formed as the union of an outer constellation of constant energy and an inner constellation of constant energy.

The DSP 20 generates (202) shaped bits from a first set of information bits. The DSP 20 applies (204) a systematic FEC scheme to encode the shaped bits and a second set of information bits, where the first set of information bits and the second set of information bits are disjoint sets.

The DSP 20 then considers a group consisting of K unshaped bits and one of the shaped bits. Each unshaped bit is either one of the second set of information bits or one of multiple parity bits resulting from the FEC encoding. For the "outer 8PSK-inner QPSK" super-constellation, K equals 5. For the "outer QPSK-inner QPSK" super-constellation, K equals 4.

The DSP 20 selects (206) one of two constellations based on a value of the shaped bit in the group. All symbols of one of the two constellations have an amplitude A, and all symbols of the other of the two constellations have an amplitude B, where A and B are real positive numbers subject to the constraints that B<A and $A^2+B^2=1$. In practice, the sum of squares may differ slightly from 1. For example, the sum $A^2+B^2$ may have a value in the range between 0.95 and 1.05, inclusive. The total number of symbols in the "outer 8PSK-inner QPSK" super-constellation is $2^3 \times 2^2 = 32$. The total number of symbols in the "outer QPSK-inner QPSK" super-constellation is $2^2 \times 2^2 = 16$.

The DSP 20 uses the K unshaped bits to select (208) a first symbol from a first of the two constellations and a second symbol from a second of the two constellations.

For the "outer 8PSK-inner QPSK" super-constellation, the DSP 20 maps three of the five unshaped bits in the group to an 8PSK symbol having the amplitude A and maps a remaining two of the five unshaped bits in the group to a QPSK symbol having the amplitude B.

For the "outer QPSK-inner QPSK" super-constellation, the DSP 20 maps two of the four unshaped bits in the group to a QPSK symbol having the amplitude A and maps a remaining two of the four unshaped bits in the group to a QPSK symbol having the amplitude B.

Depending on the value of the shaped bit in the group, either the DSP 20 maps (210) the first symbol to a first polarization and the second symbol to a second polarization that is orthogonal to the first polarization, or the DSP 20 maps (212) the second symbol to the first polarization and the first symbol to the second polarization. More specifically, the DSP 20 maps one of the symbols to two physical dimensions of an optical carrier component that is polarized in the first polarization, and maps the other of the symbols to two physical dimensions of an optical carrier component that is polarized in the second polarization. For example, the two physical dimensions may be amplitude and phase (or equivalently, in-phase and quadrature) of a polarized component of an optical carrier signal.

For the "outer 8PSK-inner QPSK" super-constellation, depending on the value of the shaped bit in the group, the DSP maps the 8PSK symbol having the amplitude A to one polarization and the QPSK symbol having the amplitude B to the orthogonal polarization.

For the "outer QPSK-inner QPSK" super-constellation, depending on the value of the shaped bit in the group, the DSP maps the QPSK symbol having the amplitude A to one polarization and the QPSK symbol having the amplitude B to the orthogonal polarization.

The DSP 20 selects (214) another group consisting of another K unshaped bits and another one of the shaped bits, and proceeds to handle the bits of that group as described above.

Let $b_0$ denote the shaped bit and $b_1$ denote the unshaped bit. Let P(0) denote the probability of the shaped bit $b_0$ being equal to 0, and P(1) denote the probability of the shaped bit $b_0$ being equal to 1.

For the "outer 8PSK-inner QPSK" super-constellation, the spectral efficiency ϵ may be calculated as given in Equation 2.

$$\epsilon = \log_2(32) - P(0)\log_2 P(0) - P(1)\log_2 P(1) \qquad (2)$$

In circumstances where the probability P(0)=P(1)=0.5, the spectral efficiency is 6 bits per time slot in a dual-polarization system. In circumstances where the probability P(0) is 0 or 1, the spectral efficiency is 5 bits per time slot in a dual-polarization system. In circumstances where the probability P(0) satisfies 0<P(0)<0.5 or 0.5<P(0)<1, the spectral efficiency is between 5 and 6 bits per time slot in a dual polarization system.

Accordingly, the method illustrated in FIG. 10, when used with the "outer 8PSK-inner QPSK" super-constellation illustrated in FIG. 8, may achieve a target spectral efficiency between 5 and 6 bits per time slot in a dual polarization system.

For the "outer QPSK-inner QPSK" super-constellation, the spectral efficiency ϵ may be calculated as given in Equation 3.

$$\epsilon = \log_2(16) - P(0)\log_2 P(0) - P(1)\log_2 P(1) \qquad (3)$$

In circumstances where the probability P(0)=P(1)=0.5, the spectral efficiency is 5 bits per time slot in a dual-polarization system. In circumstances where the probability P(0) is 0 or 1, the spectral efficiency is 4 bits per time slot in a dual-polarization system. In circumstances where the probability P(0) satisfies 0<P(0)<0.5 or 0.5<P(0)<1, the spectral efficiency is between 4 and 5 bits per time slot in a dual polarization system.

Accordingly, the method illustrated in FIG. 10, when used with the "outer QPSK-inner QPSK" super-constellation illustrated in FIG. 9, may achieve a target spectral efficiency between 4 and 5 bits per time slot in a dual polarization system.

Similarly, the method illustrated in FIG. 10, when used with an "outer 8PSK-inner 8PSK" super-constellation (not illustrated), may achieve a target spectral efficiency between 6 and 7 bits per time slot in a dual polarization system. This combination may result in a significant penalty in terms of tolerance to additive noise, which limits practicality.

The two QPSK symbols selected using the method illustrated in FIG. 10 are mapped to four physical dimensions and may be handled using the example method illustrated in FIG. 7 and discussed above.

Figure 11:
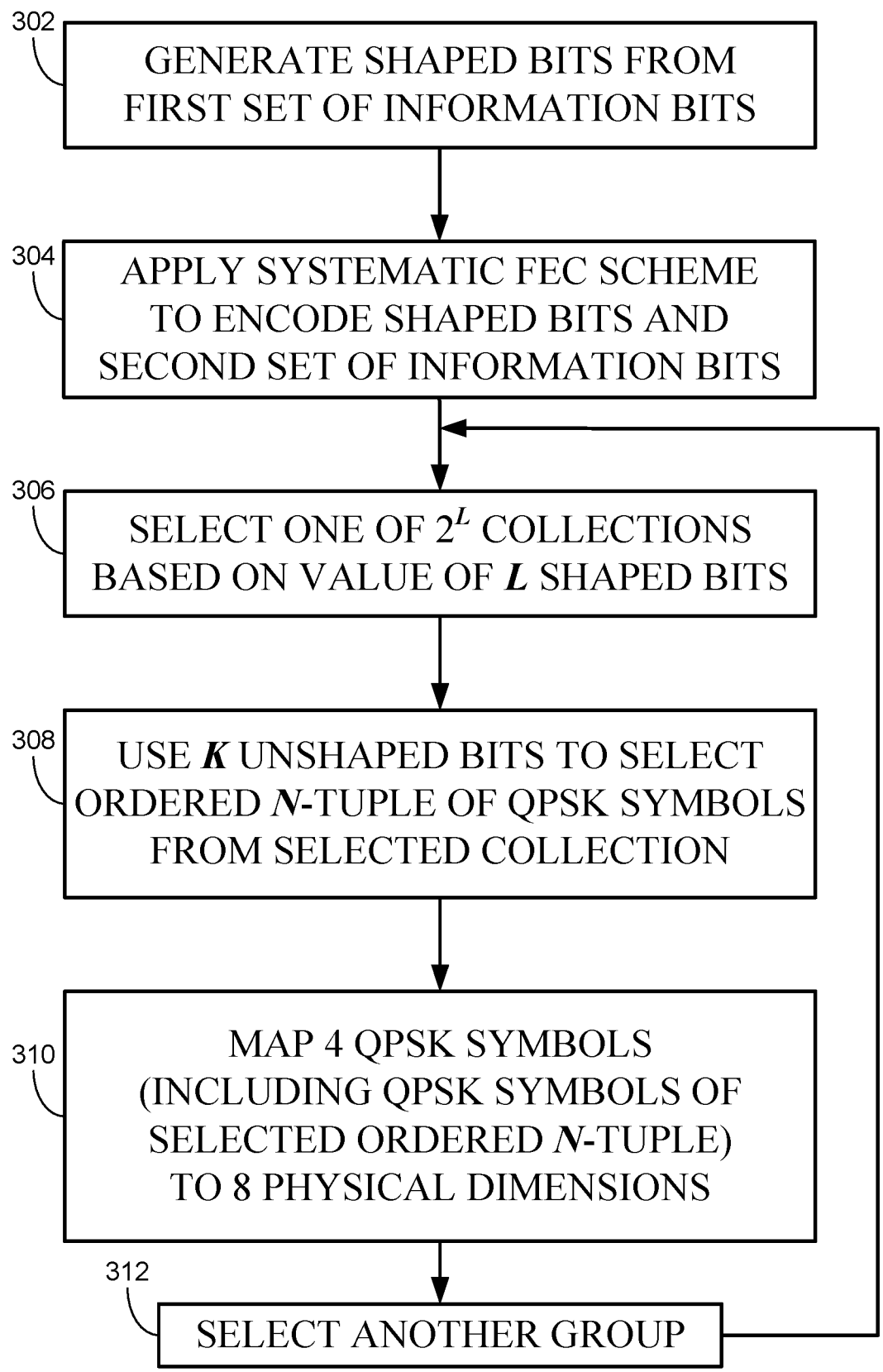
FIG. 11 is a flowchart illustration of another example method for transmission.

FIG. 11 is a flowchart of another example method for transmission. The DSP 20 generates (302) shaped bits from a first set of information bits. The DSP 20 applies (304) a systematic FEC scheme to encode the shaped bits and a second set of information bits, where the first set of information bits and the second set of information bits are disjoint sets.

The DSP then considers a group consisting of K unshaped bits and L of the shaped bits. Each unshaped bit is either one of the second set of information bits or one of multiple parity bits resulting from the FEC encoding.

The DSP 20 selects (306) one of $2^L$ collections based on a value of the L shaped bits in the group. Examples of collections are provided below.

The DSP 20 uses (308) the K unshaped bits to select an ordered N-tuple of QPSK symbols from the selected collection. For example, where N equals 3, the DSP 20 uses the K unshaped bits to select an ordered triplet of QPSK symbols from the selected collection. In another example, where N equals 4, the DSP 20 uses the K unshaped bits to select an ordered quadruplet of QPSK symbols from the selected collection.

The DSP 20 then maps (310) four QPSK symbols to eight physical dimensions. The physical dimensions may be spread across any suitable combination of polarization, time, carrier (or subcarrier) wavelength, fiber propagation mode, or core within a multi-core fiber. For example, the eight physical dimensions may be amplitude and phase (or equivalently, in-phase and quadrature) of two orthogonally-polarized components of an optical carrier signal of two different time slots. In another example, the eight physical dimensions may be amplitude and phase (or equivalently, in-phase and quadrature) of two orthogonally-polarized components of two different subcarriers of an optical signal. In examples where N equals 4, the four QPSK symbols that are mapped to eight physical dimensions are the four QPSK symbols of the selected ordered quadruplet of QPSK symbols. In examples where N equals 3, the four QPSK symbols that are mapped to eight physical dimensions include the three QPSK symbols of the selected ordered triplet of QPSK symbols. A fourth QPSK symbol is determined as follows. Let the QPSK symbols in the selected ordered triplet be denoted $X_1$, $Y_1$, and $X_2$, respectively. The fourth QPSK symbol denoted $Y_2$ satisfies a condition $X_1Y_1^* + X_2Y_2^* = 0$, where asterisk (*) denotes complex conjugate. Where the four QPSK symbols are mapped to orthogonally-polarized components of an optical carrier signal across two time slots, the condition $X_1Y_1^* + X_2Y_2^* = 0$ is referred to as "polarization balanced" and the four QPSK symbols are referred to as "polarization-balanced QPSK symbols".

The DSP 20 selects (312) another group consisting of another K unshaped bits and another L of the shaped bits, and proceeds to handle the bits of that group as described above.

Figure 12:
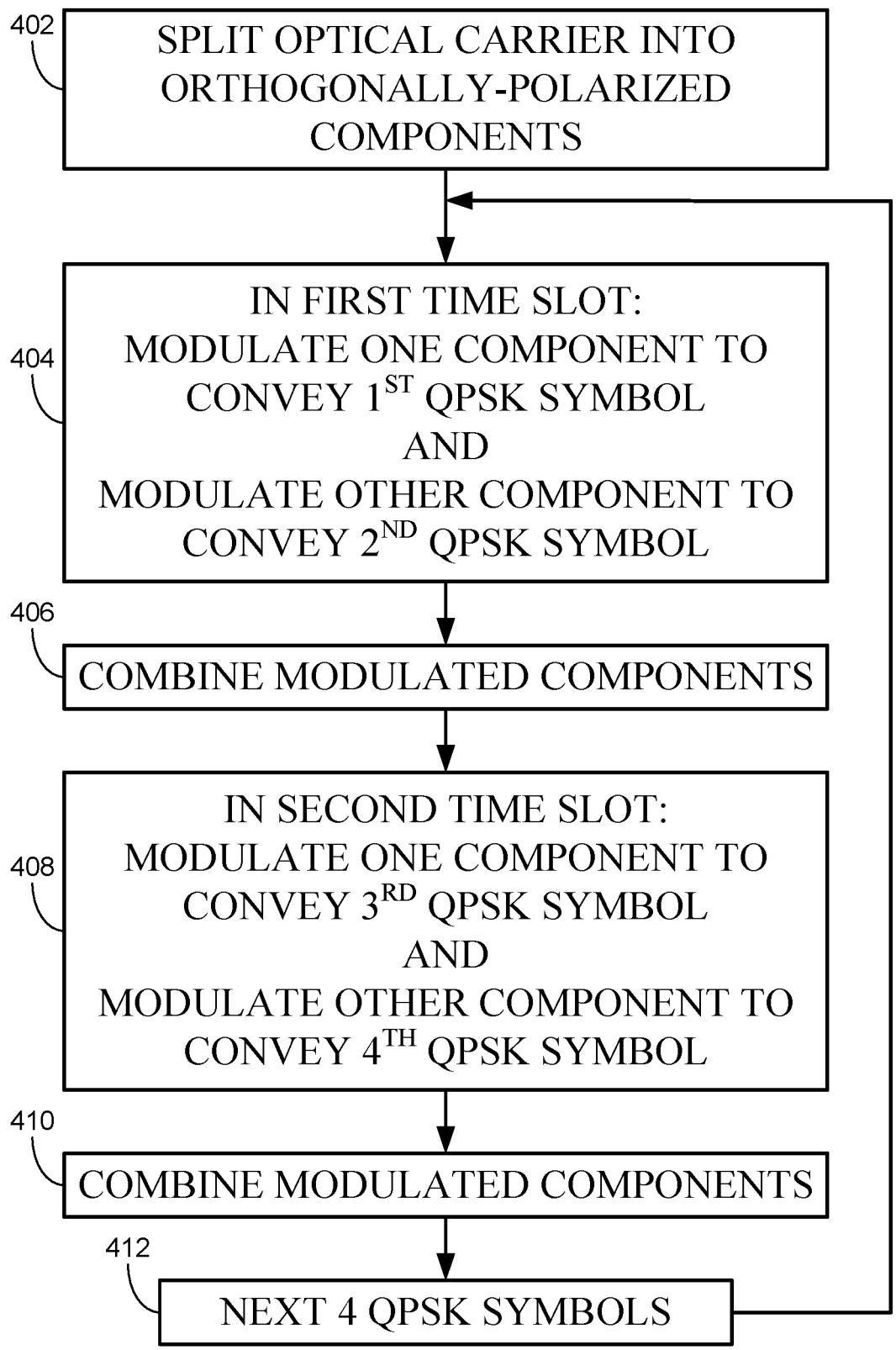
FIG. 12 is a flowchart illustration of an example method for handling four QPSK symbols that have been mapped to eight physical dimensions.

FIG. 12 is a flowchart of an example method for handling four QPSK symbols that have been mapped to eight physical dimensions. The polarization beam splitter 18 splits (402) an optical carrier into two orthogonally-polarized components. In a first time slot, one of the electrical-to-optical modulators 36 modulates (404) the orthogonally-polarized component 13 to convey the first QPSK symbol (or a processed version thereof), and the other of the electrical-to-optical modulators 36 modulates (404) the orthogonally-polarized component 15 to convey the second QPSK symbol (or a processed version thereof). The polarization beam combiner 38 combines (406) the two modulated polarized optical signals 17,19 for transmission. In a second time slot, one of the electrical-to-optical modulators 36 modulates (408) the orthogonally-polarized component 13 to convey the third QPSK symbol (or a processed version thereof), and the other of the electrical-to-optical modulators 36 modulates (408) the orthogonally-polarized component 15 to convey the fourth QPSK symbol (or a processed version thereof). The polarization beam combiner 38 combines (410) the two modulated polarized optical signals 17,19 for transmission. The next four QPSK symbols are identified (412) and the method resumes from a new "first" time slot. When modulated on to the optical carrier, symbols are effectively "spread out" in time due to the impulse response of the transmitter. That is, the digital symbols are contained within a single time slot, but this digital waveform is up-sampled to an analog waveform with a certain transmitter pulse shape. After modulation, the symbols overlap in time, and the instruction to the modulator at any instant is a sum of a number of up-sampled symbols. The wording "or a processed version thereof" in the foregoing description is intended to cover this condition.

Euclidean Distance Shaped (EDS)-256-PB-QPSK-Spectral Efficiency Between 3.5 and 4 Bits per Time Slot Consider a fourth-order Cartesian product of a QPSK constellation: $QPS^{(4)} = QPSK \otimes QPSK \otimes QPSK \otimes QPSK$. The elements of $QPSK^{(4)}$ are all 256 possible ordered quadruplets of QPSK symbols. A labeling scheme uses eight bits to label all possible ordered quadruplets of QPSK symbols. $QPSK^{(4)}$ can be partitioned into two collections. One collection, denoted "the even parity collection", consists of all 128 ordered quadruplets of QPSK symbols whose 8-bit label according to the labeling scheme has even parity. The other collection, denoted "the odd parity collection", consists of all 128 ordered quadruplets of QPSK symbols whose 8-bit label according to the labeling scheme has odd parity.

For this example, the method illustrated in FIG. 11 is used where K equals 7, L equals 1 (hence two collections), and N equals 4 (hence ordered quadruplets of QPSK symbols).

Each group consists of 7 unshaped bits and one shaped bit. The value of the one shaped bit determines whether the even parity collection is selected or the odd parity collection is selected. The 7 unshaped bits are used to select from among the 128 ordered quadruplets of QPSK symbols in the selected collection. The four QPSK symbols in the selected ordered quadruplet are mapped to eight physical dimensions.

For this example, the spectral efficiency ϵ over two time slots may be calculated as given in Equation 4.

$$\epsilon = 7 - P(0) \log_2 P(0) - P(1) \log_2 P(1) \qquad (4)$$

Accordingly, the method illustrated in FIG. 11, when used with this example, may achieve a target spectral efficiency between 3.5 and 4 bits per time slot in a dual polarization system.

EDS-128-PB-QPSK—Spectral Efficiency Between 3 and 3.5 Bits per Time Slot

Denote the symbols of a conventional QPSK constellation as $S_1$, $S_2$, $S_3$, and $S_4$.

Define a right-rotated QPSK symbol as a conventional QPSK symbol multiplied by $$\exp\left(i\frac{\pi}{8}\right).$$

Stated differently, the right-rotated QPSK constellation, $QPSK_{RIGHT}$, has the symbols $$\left\{\exp\left(i\frac{\pi}{8}\right)S_1, \exp\left(i\frac{\pi}{8}\right)S_2, \exp\left(i\frac{\pi}{8}\right)S_3, \exp\left(i\frac{\pi}{8}\right)S_4\right\}.$$

Define a left-rotated QPSK symbol as a conventional QPSK symbol multiplied by $$\exp\left(-i\frac{\pi}{8}\right).$$

Stated differently, the left-rotated QPSK constellation, $QPSK_{LEFT}$, has the symbols $$\left\{\exp\left(-i\frac{\pi}{8}\right)s_1, \exp\left(-i\frac{\pi}{8}\right)s_2, \exp\left(-i\frac{\pi}{8}\right)s_3, \exp\left(-i\frac{\pi}{8}\right)s_4\right\}.$$

One collection is a third-order Cartesian product of a right-rotated QPSK constellation: $QPSK_{RIGHT}^{(3)} = QPSK_{RIGHT} \otimes QPSK_{RIGHT} \otimes QPSK_{RIGHT}$. The elements of $QPSK_{RIGHT}^{(3)}$ are all 64 possible ordered triplets of right-rotated QPSK symbols.

The other collection is a third-order Cartesian product of a left-rotated QPSK constellation: $QPSK_{LEFT}^{(3)} = QPSK_{LEFT} \otimes QPSK_{LEFT} \otimes QPSK_{LEFT}$. The elements of $QPSK_{LEFT}$ are all 64 possible ordered triplets of left-rotated QPSK symbols.

For this example, the method illustrated in FIG. 11 is used where K equals 6, L equals 1 (hence two collections), and N equals 3 (hence ordered triplets of rotated QPSK symbols).

Each group consists of 6 unshaped bits and one shaped bit. The value of the one shaped bit determines whether the right-rotated collection is selected or the left-rotated collection is selected. The 6 unshaped bits are used to select from among the 64 ordered triplets of rotated QPSK symbols in the selected collection.

The four QPSK symbols that are mapped to eight physical dimensions include the three rotated QPSK symbols of the selected ordered triplet. A fourth QPSK symbol is determined as follows. Let the rotated QPSK symbols in the selected ordered triplet be denoted $X_1$, $Y_1$, and $X_2$, respectively. The fourth QPSK symbol denoted $Y_2$ satisfies a condition $X_1 Y_1^* + X_2 Y_2^* = 0$, where asterisk (*) denotes complex conjugate.

The three rotated QPSK symbols in the selected ordered triplet are mapped to eight physical dimensions.

For this example, the spectral efficiency c over two time slots may be calculated as given in Equation 5.

$$\epsilon = 6 - P(0)\log_2 P(0) - P(1)\log_2 P(1) \quad (5)$$

Accordingly, the method illustrated in FIG. 11, when used with this example, may achieve a target spectral efficiency between 3 and 3.5 bits per time slot in a dual polarization system.

EDS-64-PB-QPSK—Spectral Efficiency Between 2 and 3 Bits per Time Slot

Consider a third-order Cartesian product of a QPSK constellation: $QPS^{(3)} = QPSK \otimes QPSK \otimes QPSK \otimes QPSK$. The elements of $QPS^{(3)}$ are all 64 possible ordered triplets of QPSK symbols.

Consider an augmented version of $QPS^{(3)}$, denoted $QPS_{AUG}^{(3)}$, that includes 64 quadruplets of QPSK symbols. In each quadruplet, the first three QPSK symbols are identical to the three QPSK symbols that comprise a corresponding one of the 64 possible ordered triplets. Let the three QPSK symbols be denoted $X_1$, $Y_1$, and $X_2$, respectively. Determine a fourth QPSK symbol denoted $Y_2$ that satisfies a condition $X_1 Y_1^* + X_2 Y_2^* = 0$, where asterisk (*) denotes complex conjugate. Thus for each ordered triplet in $QPSK^{(3)}$ there is a corresponding ordered quadruplet in $QPS_{AUG}^{(3)}$.

$QPS_{AUG}^{(3)}$ can be partitioned into four disjoint subsets ("four collections"), each consisting of a respective 16 of the ordered quadruplets, such that the Euclidean distance between any pair of ordered quadruplets in a given collection is greater than or equal to $2\sqrt{2}$. One example partition of $QPS_{AUG}^{(3)}$ into four disjoint subsets satisfying this Euclidean distance constraint is provided in the Appendix.

As mentioned above, the DSP 20 is configured to generate shaped bits from a first set of information bits. Any PCS implementation may be used to shape the first set of information bits, thereby yielding the shaped bits.

Figure 13:
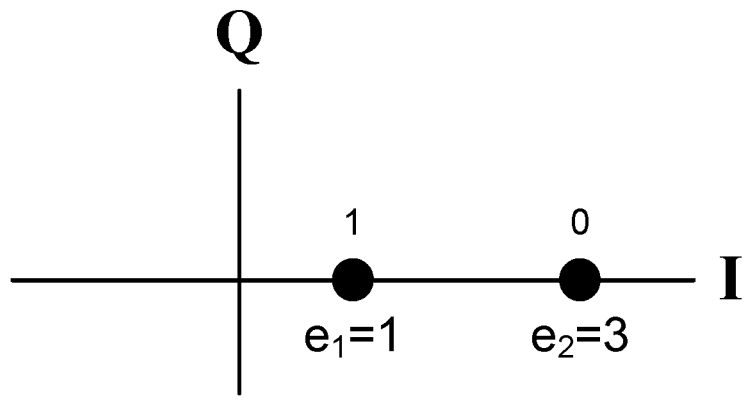
FIG. 13 is an illustration of pseudo-energies of an artificial constellation.
Figure 14:
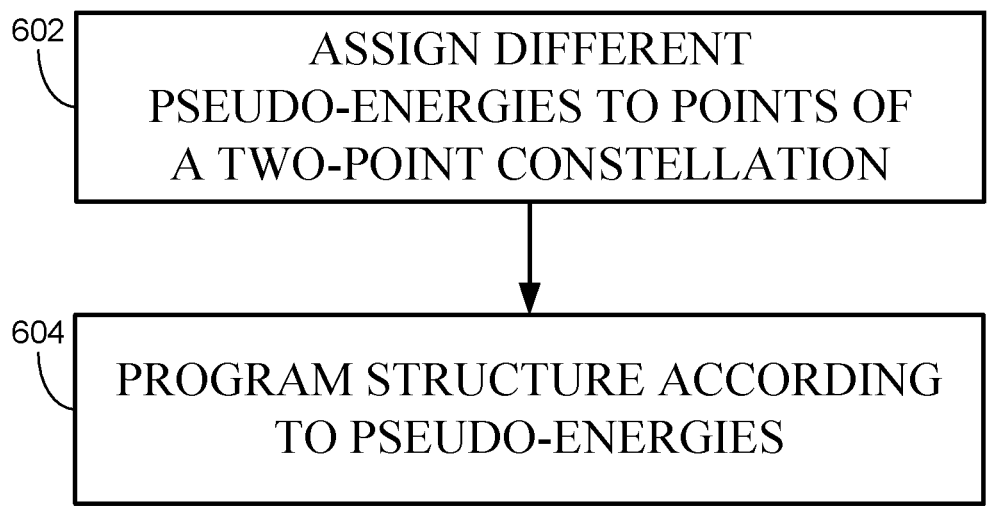
FIG. 14 is a flowchart illustration of a method for using a structure to generate shaped bits.

FIG. 13 is an illustration of an artificial constellation C consisting of two points. FIG. 14 is a flowchart illustration of a method for using a structure to generate shaped bits. Each point, whether real-valued or complex-valued, can be labelled using a single bit $b_0$. Assign (602) different pseudo-energies to the two points of the artificial constellation C. For example, assign the pseudo-energy $e_1 = 1$ to the point with the label $b_0 = 1$, and assign the pseudo-energy $e_2 = 3$ to the point with the label $b_0 = 0$. Program (604) the structure to output the required number of shaped bits while minimizing the average pseudo-energy. The structure programmed in this manner will favor $b_0 = 1$ over $b_0 = 0$. Stated differently, assigning a higher pseudo-energy to the label $b_0 = 0$ and a lower pseudo-energy to the label $b_0 = 1$ ensures that the shaped bit will have a higher probability $P(1)$ of being equal to 1 and a lower probability $P(0)$ of being equal to 0. Changing the pseudo-energies assigned to the two points will change the probabilities $P(1)$ and $P(0)$. The artificial constellation C is artificial, and the energies assigned to its points are pseudo-energies used only in the programming of the structure but not mapped to physical dimensions. The artificial constellation is a construct used to program the structure to achieve particular probabilities $P(0)$ and $P(1)$ of the shaped bits. In this example, the artificial constellation C has two points encoding 1 bit, however the number of artificial constellation points may be extended to $2^N$, where N>1, in a similar manner.

In one example, the structure implements a distribution matcher, which is a DSP algorithm for transforming a sequence of information bits into a corresponding sequence of shaped bits using, for example, the algorithm described in P. Schulte, "Constant composition distribution mapping", *IEEE Trans. Info. Theory*, vol. 62, no. 1, pp. 430-434 (2016). When programming the distribution matcher structure, the probability $P(e_1)$ of pseudo-energy $e_1$ is set to the desired probability $P(1)$ of $b_0$ being equal to 1, and a lower probability $P(0)$ of $b_0$ being equal to 0 is assigned to $P(e_2)$.

In another example, the structure is a tree structure, and programming the structure involves programming the look-up tables of the tree structure.

Let $C^{(2)}$ denote a 2-dimensional constellation constructed as the Cartesian product of the artificial constellation C with itself: $C^{(2)} = C \otimes C$. Each 2-dimensional point $S_k^{(2)}$ of $C^{(2)}$ is an ordered pair of complex-valued points of the artificial constellation C.

Let $C^{(4)}$ denote a 4-dimensional constellation constructed as the Cartesian product of $C^{(2)}$ with itself: $C^{(4)} = C^{(2)} \otimes C^{(2)}$. Each 4-dimensional point $S_k^{(4)}$ of $C^{(4)}$ is an ordered quadruplet of complex-valued points of the artificial constellation C.

Let $C^{(8)}$ denote an 8-dimensional constellation constructed as the Cartesian product of $C^{(4)}$ with itself: $C^{(8)} = C^{(4)} \otimes C^{(4)}$. Each 8-dimensional point $S_k^{(8)}$ of $C^{(8)}$ is an ordered octuplet of complex-valued points of the artificial constellation C.

Figure 15:
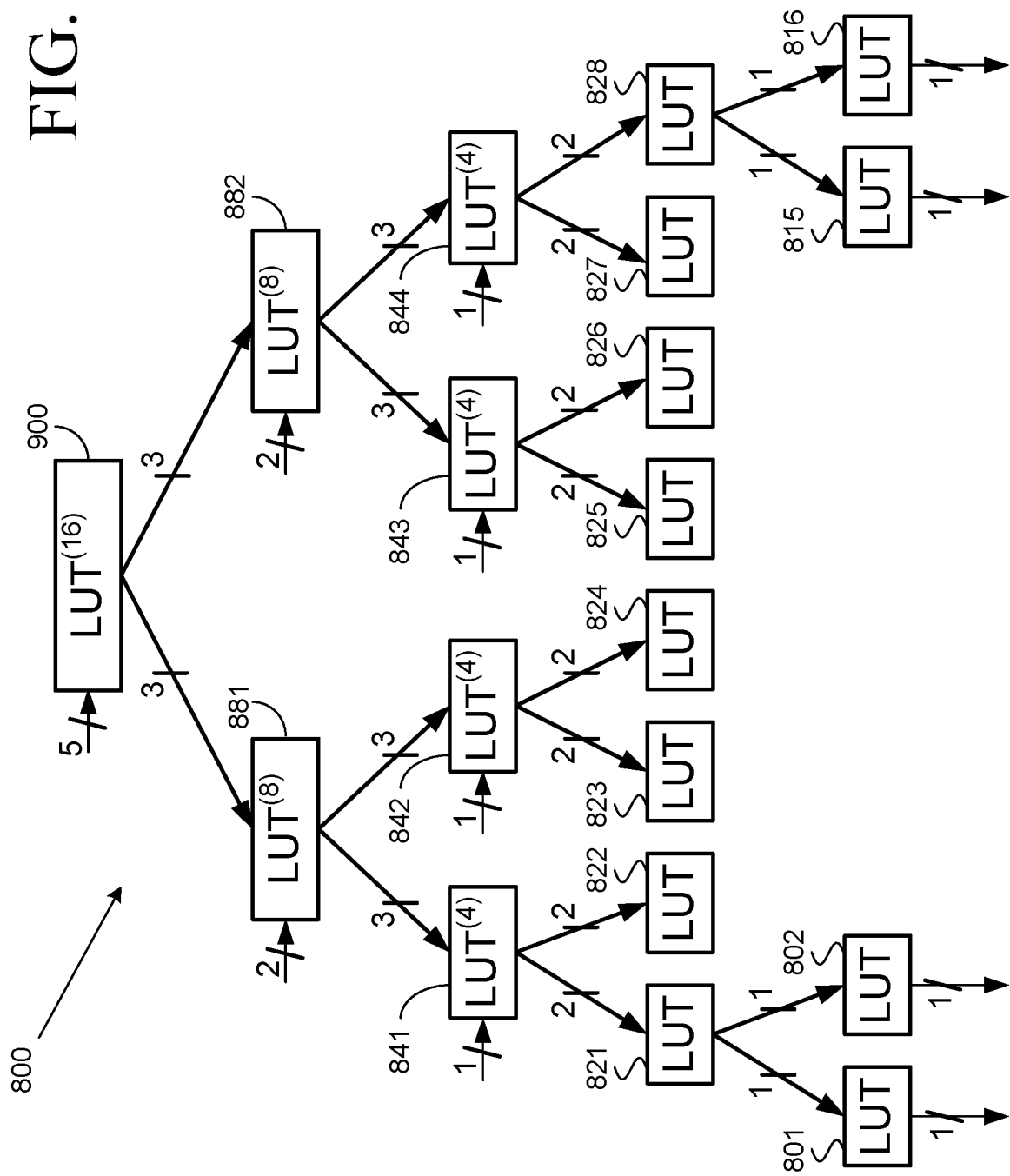
FIG. 15 is an illustration of an example tree structure.

An example tree structure 800 is illustrated in FIG. 15. The example tree structure 800 is for an 8-dimensional constellation $C^{(8)}$ constructed from the artificial constellation C illustrated in FIG. 13. The example tree structure 800 has five layers: a $1^{st}$ layer having sixteen LUTs 801 through 816, a $2^{nd}$ layer having eight LUTs 821 through 828, a $3^{rd}$ layer having four LUTs 841, 842, 843, 844, a $4^{th}$ layer having two LUTs 881, 882, and a $5^{th}$ layer having a single LUT 900. Due to space constraints, only $1^{st}$-layer LUTs 801, 802, 815 and 816 are illustrated in FIG. 15.

The example tree structure 800 maps 13 information bits to 16 shaped bits, as described in more detail below.

$1^{st}$ Layer of LUTs

Each of the $1^{st}$-layer LUTs 801 through 816 maps a 1-bit parent index to the 1 shaped bit. An example of the $1^{st}$-layer LUTs is given in Table 1:

TABLE 1

|  | 1-bit Parent Index | |
|---|---|---|
|  | 1 | 2 |
| 1-Dim Pseudo-Energy | $e_1 = 1$ | $e_2 = 3$ |
| Shaped Bit | 1 | 0 |

The artificial constellation C has two complex-valued points. The pseudo-energy of each point is also noted in Table 1. A pseudo-energy that is indexed in the $1^{st}$-layer LUTs 801 through 816 is denoted a "1-dimensional pseudo-energy".

$2^{nd}$ Layer of LUTs

There are 4 possible ordered pairs of the 1-dimensional pseudo-energies. The pseudo-energy associated with a pair of 1-dimensional pseudo-energies is the sum of the 1-dimensional pseudo-energies. A pseudo-energy that is indexed in the $2^{nd}$-layer LUTs 821 through 828 is denoted a "2-dimensional pseudo-energy".

An example of the $2^{nd}$-layer LUTs 821 through 828 is given in Table 2:

TABLE 2

| 2-bit Parent Index | | | | |
|---|---|---|---|---|
| 1 | 2 | 3 | 4 | |
| 2-Dim Pseudo-Energy | | | | |
| $e'_1 = 2$ | $e'_2 = 4$ | $e'_3 = 4$ | $e'_4 = 6$ | |
| 1 | 1 | 2 | 2 | → 1-bit left child index |
| 1 | 2 | 1 | 2 | → 1-bit right child index |

Each of the $2^{nd}$-layer LUTs 821 through 828 maps a 2-bit parent index to a 1-bit left child index and to a 1-bit right child index. The 2-bit parent index identifies one of the 4 possible 2-dimensional pseudo-energies. The 1-bit left child index is the index of the first 1-dimensional pseudo-energy in the ordered pair, and the 1-bit right child index is the index of the second 1-dimensional pseudo-energy in the ordered pair. For example, if the 2-bit parent index identifies the 2-dimensional energy $e'_3=4$, the 1-bit left child index will identify the 1-dimensional pseudo-energy $e_2$ and the 1-bit right child index will identify the 1-dimensional pseudo-energy $e_1$. Each 1-bit child index is the 1-bit parent index of a respective one of the $1^{st}$-layer LUTs 801 through 816.

$3^{rd}$ Layer of LUTs

There are 16 possible ordered pairs of the 2-dimensional pseudo-energies. The pseudo-energy associated with a pair of 2-dimensional pseudo-energies is the sum of the 2-dimensional pseudo-energies. In this example, the $3^{rd}$-layer LUTs 841, 842, 843, 844 implement 1-bit merging by considering the average of two ordered pairs of the 2-dimensional pseudo-energies. For example, the "average energy" resulting from merging the first ordered pair of 2-dimensional pseudo-energies ($e_3$; $e_1$) and the second ordered pair of 2-dimensional pseudo-energies ($e_2$; $e_2$) is 7. There are 8 such averages, which are indexed in the $3^{rd}$-layer LUTs 841, 842, 843, 844. A pseudo-energy that is indexed in the $3^{rd}$-layer LUTs 841, 842, 843, 844 is denoted a "4-dimensional pseudo-energy". This is referred to as "1-bit merging" because instead of using four bits to index the pseudo-energies of all 16 possible ordered pairs of the 2-dimensional pseudo-energies, only three bits are required to index the eight 4-dimensional pseudo-energies.

An example of the $3^{rd}$-layer LUTs 841, 842, 843, 844 is given in Table 3:

TABLE 3

| | | | 3-bit Parent Index | | | | |
|---|---|---|---|---|---|---|---|
| | 1 | 2 | 3 | 4 | ... | 7 | 8 |
| | | | 4-Dim Pseudo-Energy | | | | |
| 1 Info Bit | $e''_1 = 5$ | $e''_2 = 6$ | $e''_3 = 7$ | $e''_4 = 8$ | ... | $e''_7 = 10$ | $e''_8 = 11$ |
| 0 | 1 | 2 | 3 | 2 | ... | 4 | 4 | → 2-bit left
| 1 | 1 | 1 | 2 | 3 | ... | 3 | 4 | child index
| 0 | 1 | 1 | 1 | 3 | ... | 2 | 3 | → 2-bit right
| 1 | 2 | 3 | 2 | 2 | ... | 4 | 4 | child index Each of the $3^{rd}$-layer LUTs 841, 842, 843, 844 maps a single information bit and a 3-bit parent index to a 2-bit left child index and to a 2-bit right child index. The 3-bit parent index identifies one of the eight possible 4-dimensional pseudo-energies. The single information bit selects between the two ordered pairs of 2-dimensional pseudo-energies that were averaged to yield the identified 4-dimensional pseudo-energy. The 2-bit left child index is the index of the first 2-dimensional pseudo-energy in the ordered pair selected by the single information bit, and the 2-bit right child index is the index of the second 2-dimensional pseudo-energy in the ordered pair selected by the single information bit. For example, if the 3-bit parent index identifies the 4-dimensional pseudo-energy $e''_3=7$ and the information bits into the left and right child look-up-tables are both equal to 0, the 2-bit left child index will identify the 2-dimensional pseudo-energy $e_3$ and the 2-bit right child index will identify the 2-dimensional pseudo-energy $e_1$. Each 2-bit child index is the 2-bit parent index of a respective one of the $2^{nd}$-layer LUTs 821 through 828.

$4^{th}$ Layer of LUTs

There are 64 possible ordered pairs of the 4-dimensional pseudo-energies. The pseudo-energy associated with a pair of 4-dimensional pseudo-energies is the sum of the 4-dimensional pseudo-energies. In this example, the $4^{th}$-layer LUTs 881, 882 implement 5-bit clipping. The 5-bit clipping is the act of discarding 32 of the ordered pairs of the 4-dimensional pseudo-energies. The ordered pairs that are discarded are those having the highest pseudo-energy associated therewith. The ordered pairs are discarded in the sense that the $4^{th}$-layer LUTs 881, 882 do not index the pseudo-energies associated with those ordered pairs. This is referred to as "5-bit clipping" because $2^5$ ordered pairs remain after the clipping operation.

In this example, the $4^{th}$-layer LUTs 881, 882 implement 2-bit merging by considering the average of four ordered pairs of the 4-dimensional pseudo-energies. For example, the "average pseudo-energy" resulting from merging the four ordered pairs of 4-dimensional pseudo-energies $\{(e''_1; e''_1), (e''_1; e''_2), (e''_2; (e''_1; e''_3)\}$ is 11. In another example, the "average pseudo-energy" resulting from merging the four ordered pairs of 4-dimensional pseudo-energies $\{(e''_3; e''_1), (e''_2; e''_2), (e''_2; e''_3), (e''_3; e''_2)\}$ is 12.5. In another example, the "average pseudo-energy" resulting from merging the four ordered pairs of 4-dimensional pseudo-energies $\{(e''_1; e''_4), (e''_4; e''_1), (e''_1; e''_5), (e''_5; e''_1)\}$ is 13. There are eight such averages, which are indexed in the $4^{th}$-layer LUTs 881, 882. A pseudo-energy that is indexed in the $4^{th}$-layer LUTs 881, 882 is denoted an "8-dimensional energy". This is referred to as "2-bit merging", because instead of using 5 bits to index the not-discarded 32 ordered pairs of the 4-dimensional pseudo-energies, only 3 bits are required to index the eight 8-dimensional pseudo-energies.

An example of the $4^{th}$-layer LUTs 881, 882 is given in Table 4:

TABLE 4

| | 3-bit Parent Index | | | | | |
|---|---|---|---|---|---|---|
| | 1 | 2 | 3 | 4 | ... 8 | |
| | 8-Dim Pseudo-Energy | | | | | |
| 2 Info Bits | $e'''_1 = 11$ | $e'''_2 = 12.5$ | $e'''_3 = 13$ | $e'''_4 = 14$ | ... | |
| 00 | 1 | 3 | 1 | 2 | ... | → 3-bit left |
| 01 | 1 | 2 | 4 | 4 | ... | child index |
| 10 | 2 | 2 | 1 | 2 | ... | |
| 11 | 1 | 3 | 5 | 5 | ... | |
| 00 | 1 | 1 | 4 | 4 | ... | → 3-bit right |
| 01 | 2 | 2 | 1 | 2 | ... | child index |
| 10 | 1 | 3 | 5 | 5 | ... | |
| 11 | 3 | 2 | 1 | 2 | ... | |

Each of the $4^{th}$-layer LUTs 881, 882 maps 2 information bits and a 3-bit parent index to a 3-bit left child index and to a 3-bit right index. The 3-bit parent index identifies one of the eight possible 8-dimensional pseudo-energies. The 2 information bits select from among the four ordered pairs that were averaged to yield the identified 8-dimensional pseudo-energy. The 3-bit left child index is the index of the first 4-dimensional pseudo-energy in the ordered pair selected by the 2 information bits, and the 3-bit right child index is the index of the second 4-dimensional pseudo-energy in the ordered pair selected by the 2 information bits. For example, if the 3-bit parent index identifies the 8-dimensional pseudo-energy $e'''_3=13$ and the 2 information bits into the left and right child LUTs are equal to 10, the 3-bit left child index will identify the 4-dimensional pseudo-energy $e''_1$ and the 3-bit right child index will identify the 4-dimensional pseudo-energy $e''_5$. Each 3-bit child index is the 3-bit parent index of a respective one of the P-layer LUTs 841, 842, 843, 844.

$5^{th}$ Layer LUT

There are 64 possible ordered pairs of the 8-dimensional pseudo-energies. The pseudo-energy associated with a pair of 8-dimensional pseudo-energies is the sum of the 8-dimensional pseudo-energies. In this example, the $5^{th}$-layer LUT 900 implements 5-bit clipping. The 5-bit clipping is the act of discarding 32 of the ordered pairs of the 8-dimensional pseudo-energies. The ordered pairs that are discarded are those having the highest pseudo-energy associated therewith. The ordered pairs are discarded in the sense that the $5^{th}$-layer LUT 900 does not index the pseudo-energies associated with those ordered pairs. This is referred to as "5-bit clipping" because $2^5$ ordered pairs remain after the clipping operation.

In this example, the $5^{th}$-layer LUT 900 implements 1-bit merging by considering the average of two ordered pairs of the 8-dimensional pseudo-energies. For example, the "average pseudo-energy" resulting from merging the two ordered pairs of 8-dimensional energies $\{(e'''_1; e'''_1), (e'''_1; e'''_2)\}$ is 22.75. There are 16 such averages, which are indexed in the $5^{th}$-layer LUT 900. A pseudo-energy that is indexed in the $5^{th}$-layer LUT 900 is denoted a "16-dimensional pseudo-energy". This is referred to as "1-bit merging", because instead of using 5 bits to index the not-discarded 32 ordered pairs of the 8-dimensional pseudo-energies, only 4 bits are required to index the sixteen 16-dimensional pseudo-energies.

An example of the $5^{th}$-layer LUT 900 is given in Table 5:

TABLE 5

| | 4 Info Bits | | |
|---|---|---|---|
| Info Bit | 1 | | 16 |
| 16-Dim Pseudo-Energy | $e''''_1 = 22.75$ | ... | $e''''_{16}$ |
| 0 | 1 | | → 3-bit left |
| 1 | 1 | | child index |
| 0 | 1 | | → 3-bit right |
| 1 | 2 | | child index |

The LUT 900 maps 5 information bits to a 3-bit left child index and to a 3-bit right index. 4 of the information bits identify one of the 16 possible 16-dimensional pseudo-energies. The other 2 information bit selects from among the two ordered pairs that were averaged to yield the identified 16-dimensional pseudo-energy. The 3-bit left child index is the index of the first 8-dimensional pseudo-energy in the ordered pair selected by the 1 information bit, and the 3-bit right child index is the index of the second 8-dimensional pseudo-energy in the ordered pair selected by the 1 information bit. For example, if the 4 information bits identify the 16-dimensional pseudo-energy $e'''_1=22.75$ and the 1 information bit into the left and right child LUTs are both equal to 1, the 3-bit left child index will identify the 8-dimensional pseudo-energy $e'''_1$ and the 3-bit right child index will identify the 8-dimensional pseudo-energy $e'''_2$. Each 3-bit child index is the 3-bit parent index of a respective one of the $4^{th}$-layer LUTs 881, 882.

The preceding examples have equal bits into both child LUTs. This is only one of the possible inputs. The information bits into the left and right child LUTs are typically different. All LUTs in any given layer of the tree will have the same number of client bits.

The scope of the claims should not be limited by the details set forth in the examples, but should be given the broadest interpretation consistent with the description as a whole.

APPENDIX

Denote the alphabet of a QPSK constellation as $S_1, S_2, S_3, S_4$.

In each of the following quadruplets, the fourth QPSK symbol is uniquely determined by the values of the first three QPSK symbols. Let the three QPSK symbols be denoted $X_1, Y_1$, and $X_2$, respectively. The fourth QPSK symbol denoted $Y_2$ satisfies a condition $X_1Y_1^* + X_2Y_2^* = 0$, where asterisk (*) denotes complex conjugate.

The first collection consists of the following 16 quadruplets of ordered QPSK symbols:

$$\begin{pmatrix} X_1 = S_1 \\ Y_1 = S_1 \\ X_2 = S_1 \\ Y_2 \end{pmatrix}, \begin{pmatrix} X_1 = S_1 \\ Y_1 = S_4 \\ X_2 = S_1 \\ Y_2 \end{pmatrix}, \begin{pmatrix} X_1 = S_1 \\ Y_1 = S_1 \\ X_2 = S_4 \\ Y_2 \end{pmatrix}, \begin{pmatrix} X_1 = S_1 \\ Y_1 = S_4 \\ X_2 = S_4 \\ Y_2 \end{pmatrix},$$

$$\begin{pmatrix} X_1 = S_2 \\ Y_1 = S_2 \\ X_2 = S_2 \\ Y_2 \end{pmatrix}, \begin{pmatrix} X_1 = S_2 \\ Y_1 = S_3 \\ X_2 = S_2 \\ Y_2 \end{pmatrix}, \begin{pmatrix} X_1 = S_2 \\ Y_1 = S_2 \\ X_2 = S_3 \\ Y_2 \end{pmatrix}, \begin{pmatrix} X_1 = S_2 \\ Y_1 = S_3 \\ X_2 = S_3 \\ Y_2 \end{pmatrix},$$

$$\begin{pmatrix} X_1 = S_3 \\ Y_1 = S_3 \\ X_2 = S_3 \\ Y_2 \end{pmatrix}, \begin{pmatrix} X_1 = S_3 \\ Y_1 = S_2 \\ X_2 = S_3 \\ Y_2 \end{pmatrix}, \begin{pmatrix} X_1 = S_3 \\ Y_1 = S_3 \\ X_2 = S_2 \\ Y_2 \end{pmatrix}, \begin{pmatrix} X_1 = S_3 \\ Y_1 = S_2 \\ X_2 = S_2 \\ Y_2 \end{pmatrix},$$

$$\begin{pmatrix} X_1 = S_4 \\ Y_1 = S_4 \\ X_2 = S_4 \\ Y_2 \end{pmatrix}, \begin{pmatrix} X_1 = S_4 \\ Y_1 = S_1 \\ X_2 = S_4 \\ Y_2 \end{pmatrix}, \begin{pmatrix} X_1 = S_4 \\ Y_1 = S_4 \\ X_2 = S_1 \\ Y_2 \end{pmatrix}, \begin{pmatrix} X_1 = S_4 \\ Y_1 = S_1 \\ X_2 = S_1 \\ Y_2 \end{pmatrix}$$

The second collection consists of the following 16 quadruplets of ordered QPSK symbols:

$$\begin{pmatrix} X_1 = S_1 \\ Y_1 = S_1 \\ X_2 = S_3 \\ Y_2 \end{pmatrix}, \begin{pmatrix} X_1 = S_1 \\ Y_1 = S_4 \\ X_2 = S_3 \\ Y_2 \end{pmatrix}, \begin{pmatrix} X_1 = S_1 \\ Y_1 = S_1 \\ X_2 = S_2 \\ Y_2 \end{pmatrix}, \begin{pmatrix} X_1 = S_1 \\ Y_1 = S_4 \\ X_2 = S_2 \\ Y_2 \end{pmatrix},$$

$$\begin{pmatrix} X_1 = S_2 \\ Y_1 = S_2 \\ X_2 = S_1 \\ Y_2 \end{pmatrix}, \begin{pmatrix} X_1 = S_2 \\ Y_1 = S_3 \\ X_2 = S_1 \\ Y_2 \end{pmatrix}, \begin{pmatrix} X_1 = S_2 \\ Y_1 = S_2 \\ X_2 = S_4 \\ Y_2 \end{pmatrix}, \begin{pmatrix} X_1 = S_2 \\ Y_1 = S_3 \\ X_2 = S_4 \\ Y_2 \end{pmatrix},$$

$$\begin{pmatrix} X_1 = S_3 \\ Y_1 = S_3 \\ X_2 = S_4 \\ Y_2 \end{pmatrix}, \begin{pmatrix} X_1 = S_3 \\ Y_1 = S_2 \\ X_2 = S_4 \\ Y_2 \end{pmatrix}, \begin{pmatrix} X_1 = S_3 \\ Y_1 = S_3 \\ X_2 = S_1 \\ Y_2 \end{pmatrix}, \begin{pmatrix} X_1 = S_3 \\ Y_1 = S_2 \\ X_2 = S_1 \\ Y_2 \end{pmatrix},$$

$$\begin{pmatrix} X_1 = S_4 \\ Y_1 = S_4 \\ X_2 = S_2 \\ Y_2 \end{pmatrix}, \begin{pmatrix} X_1 = S_4 \\ Y_1 = S_1 \\ X_2 = S_2 \\ Y_2 \end{pmatrix}, \begin{pmatrix} X_1 = S_4 \\ Y_1 = S_4 \\ X_2 = S_3 \\ Y_2 \end{pmatrix}, \begin{pmatrix} X_1 = S_4 \\ Y_1 = S_1 \\ X_2 = S_3 \\ Y_2 \end{pmatrix}$$

The third collection consists of the following 16 quadruplets of ordered QPSK symbols:

$$\begin{pmatrix} X_1 = S_1 \\ Y_1 = S_3 \\ X_2 = S_1 \\ Y_2 \end{pmatrix}, \begin{pmatrix} X_1 = S_1 \\ Y_1 = S_2 \\ X_2 = S_1 \\ Y_2 \end{pmatrix}, \begin{pmatrix} X_1 = S_1 \\ Y_1 = S_3 \\ X_2 = S_4 \\ Y_2 \end{pmatrix}, \begin{pmatrix} X_1 = S_1 \\ Y_1 = S_2 \\ X_2 = S_4 \\ Y_2 \end{pmatrix},$$

$$\begin{pmatrix} X_1 = S_2 \\ Y_1 = S_1 \\ X_2 = S_2 \\ Y_2 \end{pmatrix}, \begin{pmatrix} X_1 = S_2 \\ Y_1 = S_4 \\ X_2 = S_2 \\ Y_2 \end{pmatrix}, \begin{pmatrix} X_1 = S_2 \\ Y_1 = S_1 \\ X_2 = S_3 \\ Y_2 \end{pmatrix}, \begin{pmatrix} X_1 = S_2 \\ Y_1 = S_4 \\ X_2 = S_3 \\ Y_2 \end{pmatrix},$$

$$\begin{pmatrix} X_1 = S_3 \\ Y_1 = S_4 \\ X_2 = S_3 \\ Y_2 \end{pmatrix}, \begin{pmatrix} X_1 = S_3 \\ Y_1 = S_1 \\ X_2 = S_3 \\ Y_2 \end{pmatrix}, \begin{pmatrix} X_1 = S_3 \\ Y_1 = S_4 \\ X_2 = S_2 \\ Y_2 \end{pmatrix}, \begin{pmatrix} X_1 = S_3 \\ Y_1 = S_1 \\ X_2 = S_2 \\ Y_2 \end{pmatrix},$$

$$\begin{pmatrix} X_1 = S_4 \\ Y_1 = S_2 \\ X_2 = S_4 \\ Y_2 \end{pmatrix}, \begin{pmatrix} X_1 = S_4 \\ Y_1 = S_3 \\ X_2 = S_4 \\ Y_2 \end{pmatrix}, \begin{pmatrix} X_1 = S_4 \\ Y_1 = S_2 \\ X_2 = S_1 \\ Y_2 \end{pmatrix}, \begin{pmatrix} X_1 = S_4 \\ Y_1 = S_3 \\ X_2 = S_1 \\ Y_2 \end{pmatrix}$$

The fourth collection consists of the following 16 quadruplets of ordered QPSK symbols:

$$\begin{pmatrix} X_1 = S_1 \\ Y_1 = S_3 \\ X_2 = S_3 \\ Y_2 \end{pmatrix}, \begin{pmatrix} X_1 = S_1 \\ Y_1 = S_2 \\ X_2 = S_3 \\ Y_2 \end{pmatrix}, \begin{pmatrix} X_1 = S_1 \\ Y_1 = S_3 \\ X_2 = S_2 \\ Y_2 \end{pmatrix}, \begin{pmatrix} X_1 = S_1 \\ Y_1 = S_2 \\ X_2 = S_2 \\ Y_2 \end{pmatrix},$$

$$\begin{pmatrix} X_1 = S_2 \\ Y_1 = S_1 \\ X_2 = S_1 \\ Y_2 \end{pmatrix}, \begin{pmatrix} X_1 = S_2 \\ Y_1 = S_4 \\ X_2 = S_1 \\ Y_2 \end{pmatrix}, \begin{pmatrix} X_1 = S_2 \\ Y_1 = S_1 \\ X_2 = S_4 \\ Y_2 \end{pmatrix}, \begin{pmatrix} X_1 = S_2 \\ Y_1 = S_4 \\ X_2 = S_4 \\ Y_2 \end{pmatrix}$$

-continued $$\begin{pmatrix} X_1 = S_3 \\ Y_1 = S_4 \\ X_2 = S_4 \\ Y_2 \end{pmatrix}, \begin{pmatrix} X_1 = S_3 \\ Y_1 = S_1 \\ X_2 = S_4 \\ Y_2 \end{pmatrix}, \begin{pmatrix} X_1 = S_3 \\ Y_1 = S_4 \\ X_2 = S_1 \\ Y_2 \end{pmatrix}, \begin{pmatrix} X_1 = S_3 \\ Y_1 = S_1 \\ X_2 = S_1 \\ Y_2 \end{pmatrix},$$

$$\begin{pmatrix} X_1 = S_4 \\ Y_1 = S_2 \\ X_2 = S_2 \\ Y_2 \end{pmatrix}, \begin{pmatrix} X_1 = S_4 \\ Y_1 = S_3 \\ X_2 = S_2 \\ Y_2 \end{pmatrix}, \begin{pmatrix} X_1 = S_4 \\ Y_1 = S_2 \\ X_2 = S_3 \\ Y_2 \end{pmatrix}, \begin{pmatrix} X_1 = S_4 \\ Y_1 = S_3 \\ X_2 = S_3 \\ Y_2 \end{pmatrix}$$

The Euclidean distance for any pair of quadruplets in a given collection is greater than or equal to $2\sqrt{2}$.

What is claimed is:

1. An optical transmitter device comprising:
a digital signal processor (DSP) comprising digital hardware, the DSP operative
   to generate shaped bits from a first set of information bits;
   to apply a systematic forward error correction (FEC) scheme to encode the shaped bits and a second set of information bits, where the first set of information bits and the second set of information bits are disjoint sets; and
   for multiple pairs of groups, each pair consisting of a first group and a second group, each first group consisting of a first unshaped bit and a first shaped bit and each second group consisting of a second unshaped bit and second shaped bit
      to map the first unshaped bit and the first shaped bit to a first quadrature phase shift keying (QPSK) symbol according to a labeling scheme;
      to map the second unshaped bit and the second one of the shaped bits to a second QPSK symbol according to the labeling scheme; and
      to map the first QPSK symbol and the second QPSK symbol to four physical dimensions,
   wherein each unshaped bit is either one of the second set of information bits or one of multiple parity bits resulting from the FEC encoding; and
   wherein either the least significant bit in all groups is always one of the shaped bits or the most significant bit in all groups is always one of the shaped bits.

2. The optical transmitter device recited in claim 1, further comprising
   a first modulator operative to modulate a first component of an optical carrier to convey the first QPSK symbol, the first component polarized in a first polarization; and
   a second modulator operative to modulate a second component of the optical carrier to convey the second QPSK symbol, the second component polarized in a second polarization that is orthogonal to the first polarization.

3. The optical transmitter device recited in claim 1, wherein the DSP is operative to apply any arbitrary shaping algorithm to the first set of information bits to generate the shaped bits.

4. The optical transmitter device recited in claim 1, wherein the DSP is operative to apply a tree encoding structure to the first set of information bits to generate the shaped bits, the tree encoding structure having look-up tables that were programmed according to different pseudo-energies that were assigned to points of a two-point constellation.

5. An optical transmitter device comprising:
a digital signal processor (DSP) comprising digital hardware, the DSP operative
   to generate shaped bits from a first set of information bits;
   to apply a systematic forward error correction (FEC) scheme to encode the shaped bits and a second set of information bits, where the first set of information bits and the second set of information bits are disjoint sets; and
   for multiple groups, each group consisting of K unshaped bits and one shaped bit,
      to select one of two constellations based on a value of the shaped bit, where all symbols of one of the two constellations have an amplitude A, all symbols of the other of the two constellations have an amplitude B, A and B are real positive numbers, B<A, and a sum of squares of the amplitudes $A^2+B^2$ is equal to 1 or differs slightly from 1,
      to use the K unshaped bits to select a first symbol from a first of the two constellations and a second symbol from a second of the two constellations;
      where the first of the two constellations is selected, to map the first symbol to two physical dimensions of an optical carrier component that is polarized in a first polarization and to map the second symbol to two physical dimensions of an optical carrier component that is polarized in a second polarization that is orthogonal to the first polarization; and
      where the second of the two constellations is selected, to map the second symbol to the two physical dimensions of the optical carrier component that is polarized in the first polarization and to map the first symbol to the two physical dimensions of the optical carrier component that is polarized in the second polarization,
   wherein each of the K unshaped bits is either one of the second set of information bits or one of multiple parity bits resulting from the FEC encoding, and K is a positive integer greater than three.

6. The optical transmitter device recited in claim 5, where K equals 5, the constellation whose symbols have the amplitude A is an 8 phase shift keying (8PSK) constellation, and the constellation whose symbols have the amplitude B is a QPSK constellation.

7. The optical transmitter device recited in claim 5, where K equals 4, and the two constellations are QPSK constellations.

8. The optical transmitter device recited in claim 5, wherein the DSP is operative to apply any arbitrary shaping algorithm to the first set of information bits to generate the shaped bits.

9. The optical transmitter device recited in claim 5, wherein the DSP is operative to apply a tree encoding structure to the first set of information bits to generate the shaped bits, the tree encoding structure having look-up tables that were programmed according to different pseudo-energies that were assigned to points of a two-point constellation.

10. An optical transmitter device comprising:
a digital signal processor (DSP) comprising digital hardware, the DSP operative
   to generate shaped bits from a first set of information bits;
   to apply a systematic forward error correction (FEC) scheme to encode the shaped bits and a second set of information bits, where the first set of information bits and the second set of information bits are disjoint sets; and for multiple groups, each group consisting of seven unshaped bits and one of the shaped bits
to select one of two collections based on a value of the one of the shaped bits;
to use the seven unshaped bits to select an ordered quadruplet of QPSK symbols from the selected collection; and
to map the four QPSK symbols of the selected ordered quadruplet to eight physical dimensions, wherein each of the seven unshaped bits is either one of the second set of information bits or one of multiple parity bits resulting from the FEC encoding, and wherein a labeling scheme uses eight bits to label all 256 possible ordered quadruplets of QPSK symbols, one of the two collections consists of all 128 ordered quadruplets of QPSK symbols whose 8-bit label according to the labeling scheme has even parity, and the other of the two collections consists of all 128 ordered quadruplets of QPSK symbols whose 8-bit label according to the labeling scheme has odd parity.

11. The optical transmitter device recited in claim 10, further comprising
a first modulator operative to modulate, in a first time slot, a first component of an optical carrier according to a first of the four QPSK symbols or a processed version thereof, the first component polarized in a first polarization, and to modulate, in a second time slot, the first component of the optical carrier according to a third of the four QPSK symbols or a processed version thereof; and
a second modulator operative to modulate, in the first time slot, a second component of the optical carrier according to a second of the four QPSK symbols or a processed version thereof, the second component polarized in a second polarization that is orthogonal to the first polarization, and to modulate, in the second time slot, the second component of the optical carrier according to a fourth of the four QPSK symbols or a processed version thereof.

12. The optical transmitter device recited in claim 10, wherein the DSP is operative to apply any arbitrary shaping algorithm to the first set of information bits to generate the shaped bits.

13. The optical transmitter device recited in claim 10, wherein the DSP is operative to apply a tree encoding structure to the first set of information bits to generate the shaped bits, the tree encoding structure having look-up tables that were programmed according to different pseudo-energies that were assigned to points of a two-point constellation.

14. An optical transmitter device comprising:
a digital signal processor (DSP) comprising digital hardware, the DSP operative
to generate shaped bits from a first set of information bits;
to apply a systematic forward error correction (FEC) scheme to encode the shaped bits and a second set of information bits, where the first set of information bits and the second set of information bits are disjoint sets; and
for multiple groups, each group consisting of four unshaped bits and two of the shaped bits
to select one of four collections based on a value of the two of the shaped bits;
to use the four unshaped bits to select an ordered triplet of QPSK symbols from the selected collection; and
to map four QPSK symbols, including the QPSK symbols of the selected ordered triplet, to eight physical dimensions, wherein each of the four unshaped bits is either one of the second set of information bits or one of multiple parity bits resulting from the FEC encoding, wherein a third-order Cartesian product of a QPSK constellation consists of all 64 possible ordered triplets of QPSK symbols, and the four collections are disjoint subsets of an augmented version of the third-order Cartesian product, each of the four collections consisting of a respective 16 of the ordered triplets, and wherein the QPSK symbols in the selected ordered triplet are denoted $X_1$, $Y_1$, and $X_2$, respectively, and an additional QPSK symbol denoted $Y_2$ of the four QPSK symbols satisfies a condition $X_1Y_1^*+X_2Y_2^*=0$, where asterisk (*) denotes complex conjugate, such that a Euclidean distance between any pair of ordered quadruplets in the collection is greater than or equal to $2\sqrt{2}$.

15. The optical transmitter device recited in claim 14, further comprising
a first modulator operative to modulate, in a first time slot, a first component of an optical carrier according to a first of the four QPSK symbols or a processed version thereof, the first component polarized in a first polarization, and to modulate, in a second time slot, the first component of the optical carrier according to a third of the four QPSK symbols or a processed version thereof; and
a second modulator operative to modulate, in the first time slot, a second component of the optical carrier according to a second of the four QPSK symbols or a processed version thereof, the second component polarized in a second polarization that is orthogonal to the first polarization, and to modulate, in the second time slot, the second component of the optical carrier according to a fourth of the four QPSK symbols or a processed version thereof.

16. The optical transmitter device recited in claim 14, wherein the DSP is operative to apply any arbitrary shaping algorithm to the first set of information bits to generate the shaped bits.

17. The optical transmitter device recited in claim 14, wherein the DSP is operative to apply a tree encoding structure to the first set of information bits to generate the shaped bits, the tree encoding structure having look-up tables that were programmed according to different pseudo-energies that were assigned to points of a two-point constellation.

18. An optical transmitter device comprising:
a digital signal processor (DSP) comprising digital hardware, the DSP operative
to generate shaped bits from a first set of information bits;
to apply a systematic forward error correction (FEC) scheme to encode the shaped bits and a second set of information bits, where the first set of information bits and the second set of information bits are disjoint sets; and
for multiple groups, each group consisting of six unshaped bits and one of the shaped bits
to select one of two collections based on a value of the one of the shaped bits;

to use the four unshaped bits to select an ordered triplet of QPSK symbols from the selected collection; and to map four QPSK symbols, including the QPSK symbols of the selected ordered triplet, to eight physical dimensions, wherein each of the four unshaped bits is either one of the second set of information bits or one of multiple parity bits resulting from the FEC encoding, wherein a right-rotated QPSK symbol is a conventional QPSK symbol multiplied by $\exp(+i\pi/8)$ and a left-rotated QPSK symbol is a conventional QPSK symbol multiplied by $\exp(-i\pi/8)$, wherein one of the two collections consists of all 64 possible ordered triplets of right-rotated QPSK symbols, and the other of the collections consists of all 64 possible ordered triplets of left-rotated QPSK symbols, and wherein the QPSK symbols in the selected ordered triplet are denoted $X_1$, $Y_1$, and $X_2$, respectively, and an additional QPSK symbol denoted $Y_2$ of the four QPSK symbols satisfies a condition $X_1Y_1^*+X_2Y_2^*=0$, where asterisk (*) denotes complex conjugate.

19. The optical transmitter device recited in claim 18, further comprising a first modulator operative to modulate, in a first time slot, a first component of an optical carrier according to a first of the four QPSK symbols or a processed version thereof, the first component polarized in a first polarization, and to modulate, in a second time slot, the first component of the optical carrier according to a third of the four QPSK symbols or a processed version thereof; and a second modulator operative to modulate, in the first time slot, a second component of the optical carrier according to a second of the four QPSK symbols or a processed version thereof, the second component polarized in a second polarization that is orthogonal to the first polarization, and to modulate, in the second time slot, the second component of the optical carrier according to a fourth of the four QPSK symbols or a processed version thereof.

20. The optical transmitter device recited in claim 18, wherein the DSP is operative to apply any arbitrary shaping algorithm to the first set of information bits to generate the shaped bits.

21. The optical transmitter device recited in claim 18, wherein the DSP is operative to apply a tree encoding structure to the first set of information bits to generate the shaped bits, the tree encoding structure having look-up tables that were programmed according to different pseudo-energies that were assigned to points of a two-point constellation.

* * * * *